United States Patent
Kim et al.

(10) Patent No.: US 7,609,584 B2
(45) Date of Patent: Oct. 27, 2009

(54) LATENCY CONTROL CIRCUIT AND METHOD THEREOF AND AN AUTO-PRECHARGE CONTROL CIRCUIT AND METHOD THEREOF

(75) Inventors: Joung-Yeal Kim, Yongin-si (KR);
Seong-Jin Jang, Seongnam-si (KR);
Kyoung-Ho Kim, Hwaseong-si (KR);
Sam-Young Bang, Yongin-si (KR);
Reum Oh, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 235 days.

(21) Appl. No.: 11/594,807

(22) Filed: Nov. 9, 2006

(65) Prior Publication Data

US 2007/0115751 A1    May 24, 2007

(30) Foreign Application Priority Data

Nov. 19, 2005   (KR)  ...................... 10-2005-0111027
May 3, 2006     (KR)  ...................... 10-2006-0039897
Jul. 6, 2006    (KR)  ...................... 10-2006-0063463

(51) Int. Cl.
*G11C 8/00* (2006.01)

(52) U.S. Cl. .............. 365/233.18; 385/194; 385/230.08; 385/233.1

(58) Field of Classification Search ................. 365/194, 365/230.08, 233, 233.18
See application file for complete search history.

(56) References Cited

U.S. PATENT DOCUMENTS

| | | | |
|---|---|---|---|
| 6,356,494 B2 | 3/2002 | Jang et al. | |
| 6,914,850 B2 | 7/2005 | Chai | |
| 7,085,192 B2 * | 8/2006 | Fujisawa et al. ....... | 365/189.15 |
| 2002/0036947 A1 | 3/2002 | Kouchi et al. | |
| 2004/0233773 A1 | 11/2004 | Shin | |
| 2004/0264275 A1 | 12/2004 | Gou | |
| 2006/0104150 A1 * | 5/2006 | Yoshida et al. ............... | 365/233 |

FOREIGN PATENT DOCUMENTS

JP          2000-030456        1/2000

(Continued)

OTHER PUBLICATIONS

German Office Action dated Sep. 3, 2008.

*Primary Examiner*—Hoai V Ho
(74) *Attorney, Agent, or Firm*—Harness, Dickey & Pierce, P.L.C.

(57) ABSTRACT

A latency control circuit and method thereof and auto-precharge control circuit and method thereof are provided. The example latency control circuit may include a master unit activating at least one master signal based on a reference signal and an internal clock signal and a plurality of slave units receiving the at least one master signal, each of the plurality of slave units receiving a plurality of signals and outputting an output signal based at least in part upon one of the received plurality of signals. The example method of latency control may include receiving at least one master signal, the received at least one master signal activated based on a reference signal and an internal clock signal and receiving a plurality of signals and outputting an output signal based at least in part upon one of the received plurality of signals and latency information. The example auto-precharge control circuit may include a precharge command delay unit generating a plurality of first precharge command delay signals in response to an internal clock signal and a write auto-precharge command signal, at least one bank address delay unit outputting a delayed bank address signal and a precharge main signal generator outputting a precharge main signal to banks based on the delayed bank address signal. The method of performing a precharging operation with the auto-precharge control circuit may include delaying a bank address signal based on a minimum time interval between executed memory commands and outputting a precharge main signal to one or more memory banks based on the delayed bank address signal.

32 Claims, 28 Drawing Sheets

FOREIGN PATENT DOCUMENTS

| | | |
|---|---|---|
| JP | 2001-148191 | 5/2001 |
| JP | 2002-117672 | 4/2002 |
| JP | 2004-253123 | 9/2004 |
| KR | 1020000011667 A | 2/2000 |
| KR | 1020000045402 A | 7/2000 |
| KR | 1020010067430 A | 7/2001 |
| KR | 1020020015864 A | 3/2002 |
| KR | 10-0532421 | 8/2004 |
| KR | 1020040074283 A | 8/2004 |
| KR | 1020050003527 A | 1/2005 |
| KR | 1020050011954 A | 1/2005 |

* cited by examiner

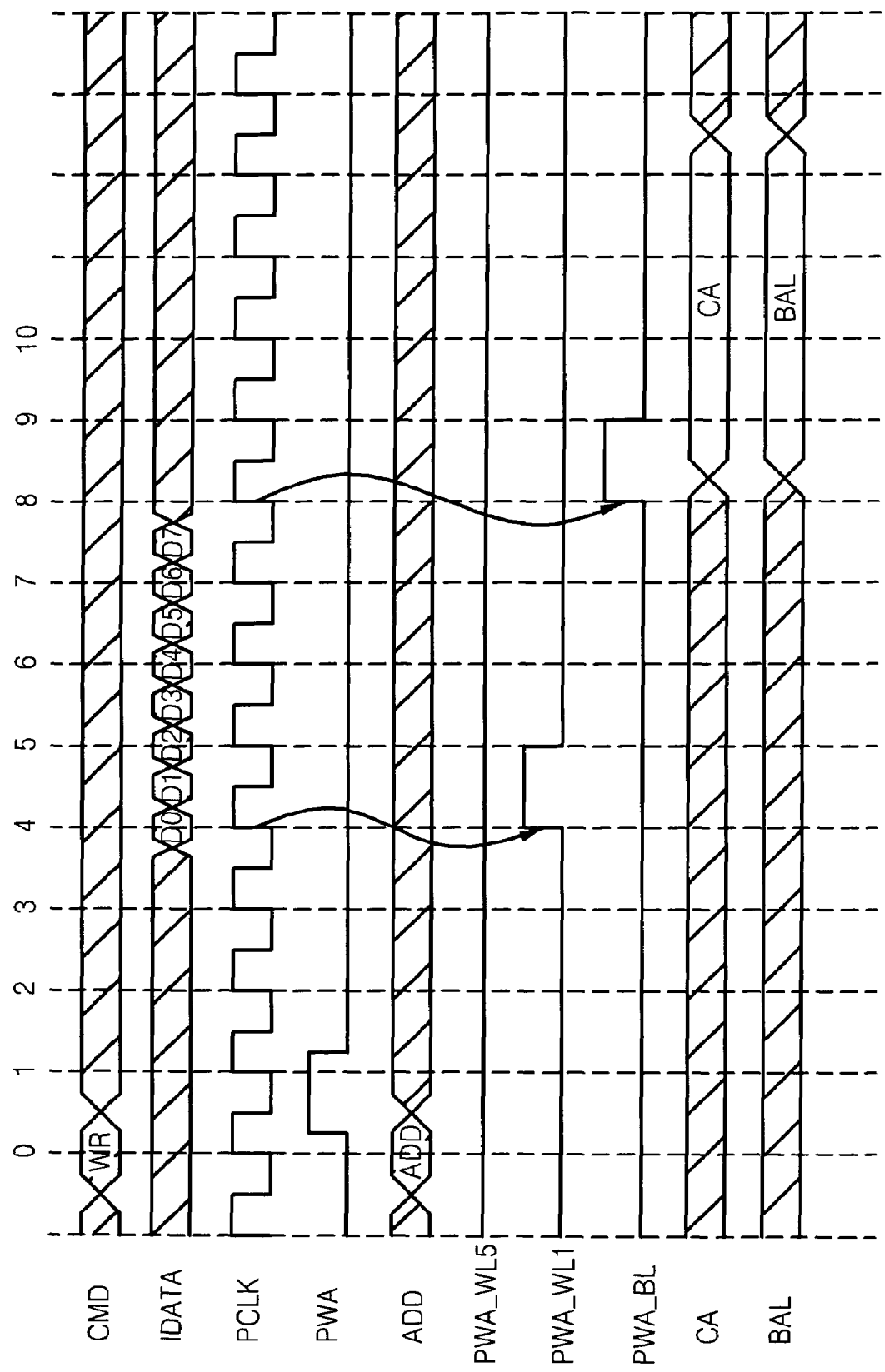

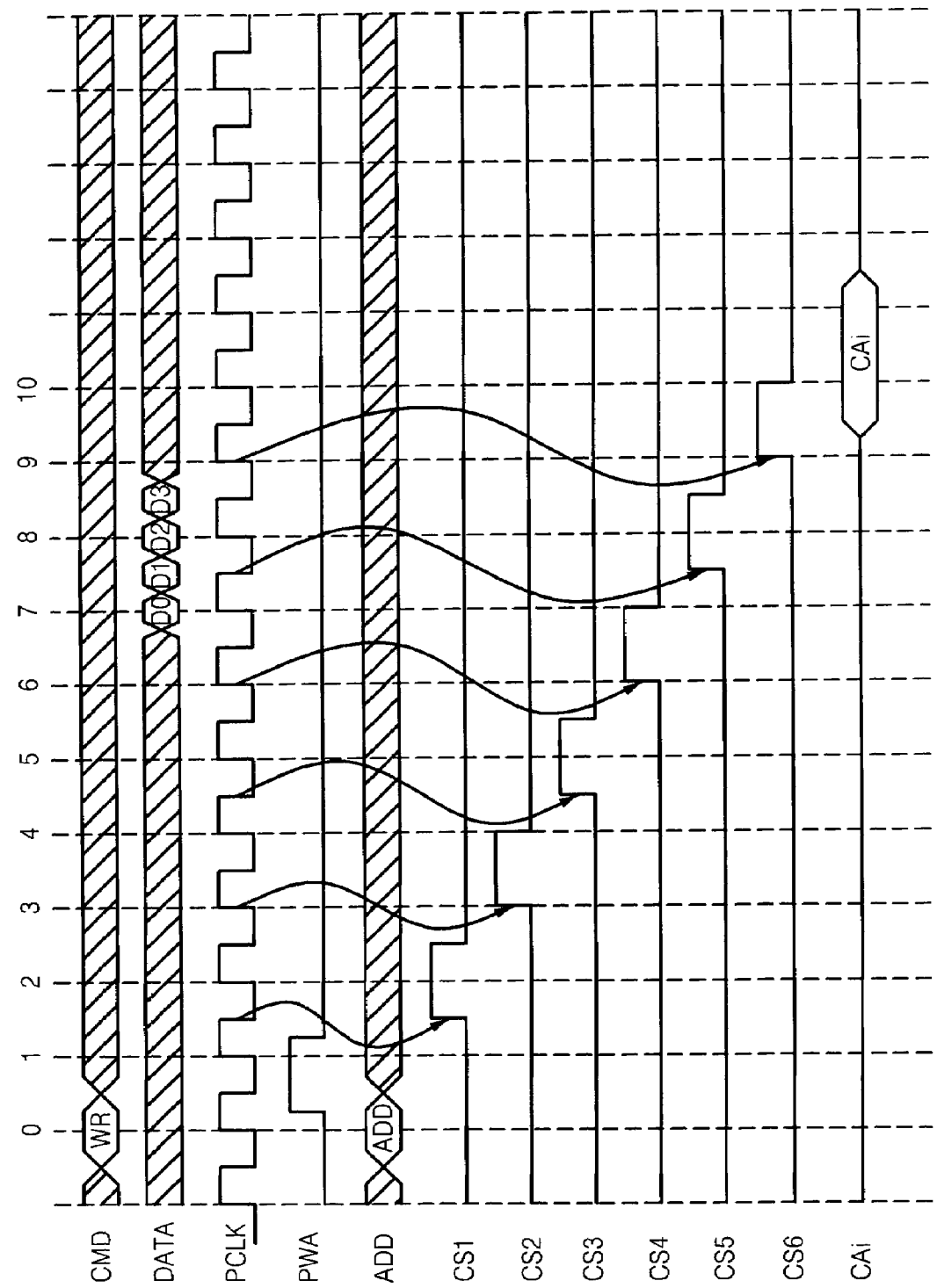

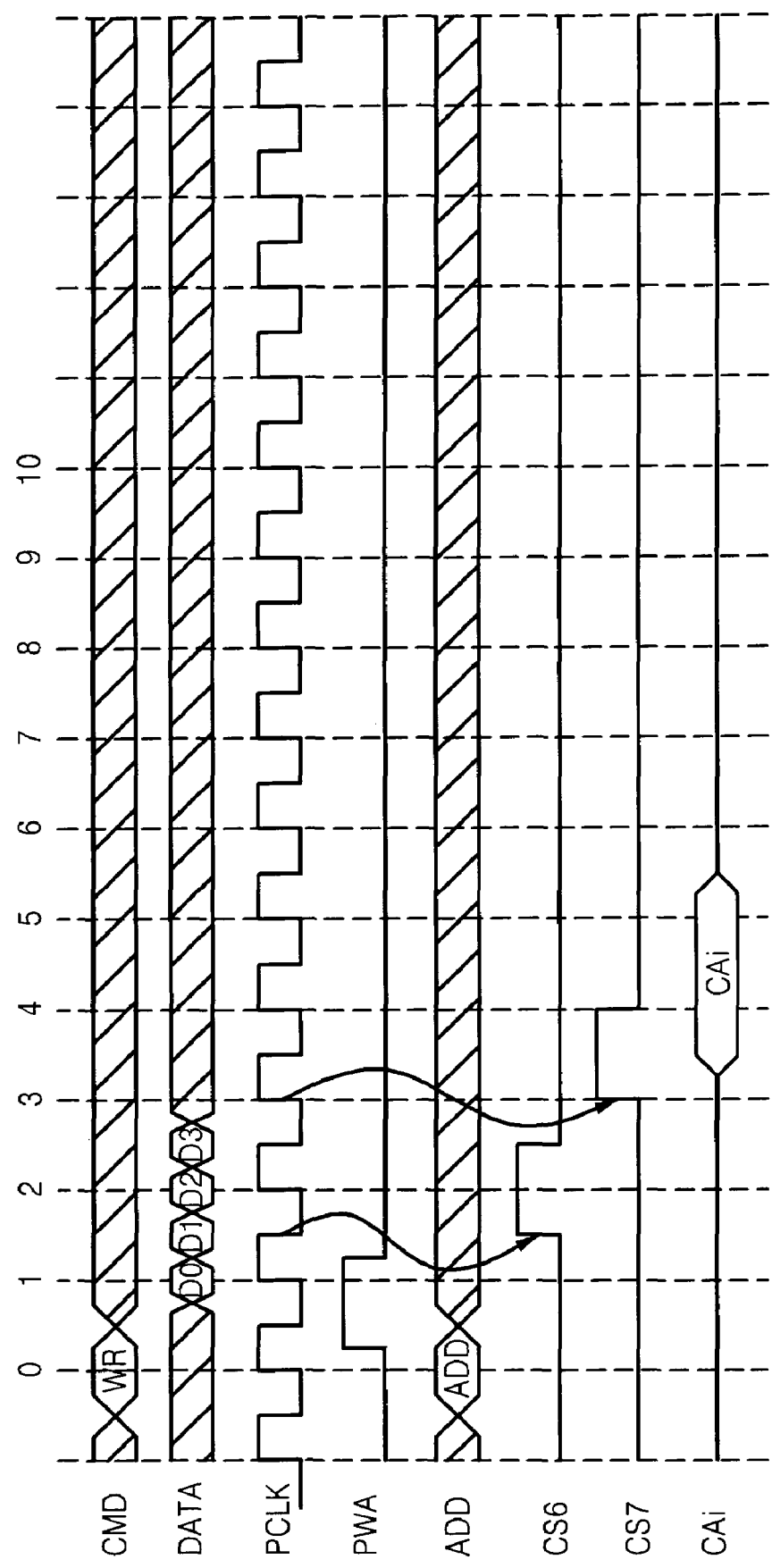

US 7,609,584 B2

LATENCY CONTROL CIRCUIT AND METHOD THEREOF AND AN AUTO-PRECHARGE CONTROL CIRCUIT AND METHOD THEREOF

This application claims the priority of Korean Patent Application No. 10-2005-0111027, filed on Nov. 19, 2005, Korean Patent Application No. 10-2006-0039897, filed on May 3, 2006, and Korean Patent Application No. 10-2006-0063463, filed on Jul. 6, 2006, in the Korean Intellectual Property Office, the contents of which are incorporated herein in their entirety by reference.

BACKGROUND OF THE INVENTION

1. Field of the Invention

Example embodiments of the present invention relate generally to a latency control circuit and method thereof and an auto-precharge control circuit, and more particularly to a latency controlling circuit and a method of controlling latency and an auto-precharge control circuit.

2. Description of the Related Art

Data may be input to and/or output from a synchronous semiconductor device in synchronization with an external clock signal. Double data rate (DDR) dynamic random access memory (DRAM) may use a write latency (WL) scheme and/or an additive latency (AL) scheme to increase an efficiency of an address bus line or a command bus line.

If the latency scheme is used, after a number of clock cycles corresponding to latency have been counted, in response to a command received from a controller (e.g., a read or write command), an address signal may be activated for designating a memory address to/from which an internal command signal and/or data may be input/output. A circuit for delaying an external address signal or command signal by WL, AL, or (WL+AL) may further be included.

FIG. 24 is a circuit diagram illustrating a conventional latency control circuit 1500. Referring to FIG. 24, the conventional latency control circuit 1500 may include a plurality of registers 1511 through 1517 and a plurality of multiplexers 1521 through 1527, which may be connected to each other in series. A WL signal WLi (e.g., where I=1~M) may be based on WL. For example, if WL is set to 7, only a signal WL7 may be activated (e.g., set to a first logic level, such as a higher logic level or logic "1") and the remaining signals WLi, where I=1, 2, 3, 4, 5, 6, may be deactivated (e.g., set to a second logic level, such as a lower logic level or logic "0"). Accordingly, if the WL is 7, an address signal Ai may pass through the 7 registers 1511 through 1517 and then may be output as a delayed address signal CAi. Alternatively, if the WL is 4, the address signal Ai may pass through 4 registers 1511 through 1514 and then may be output as a delayed address signal CAi, and so on. Accordingly, after input latency (WL+AL), which may be caused due to an external command (e.g., a write command), a column address CAi for activating a column selection line may be generated. Therefore, a number of registers may be at least equal to the number of input latencies (AL+WL) for each bit of the address signal Ai. In an example, each register may be implemented by a flip-flop. Thus, a number of flip-flops may equal the number of input latencies within a circuit generating a bit of an address signal so that the circuit may be synchronized with an internal clock signal PCLK and may delay the address signals by desired latencies, thereby generating the column address CAi.

Because many flip-flops may be included in the conventional latency control circuit 1500, a current consumption may be relatively large. In addition, a higher-proportion of an available layout area may be reserved for the flip-flops within the conventional latency control circuit 1500.

With increases in operating frequencies (e.g., above 800 MHz in DDR-DRAM), AL and WL may increase to 10 or more. As a result, a number of registers required to perform latency control on an address and/or a command may likewise increase. For example, if AL is 8 and WL is 10 in a 512 Megabyte (MB) DDR synchronous DRAM (SDRAM), 18 registers (i.e., 8 registers for AL and 10 registers for WL) may be required for each bit of a 16-bit address signal. In addition, 8 registers for AL may be required for each command. Thus, if a total of 5 commands (e.g., /WE, /CS, /RAS, /CAS, and /OE) are externally received, a number of registers required for latency control on addresses and commands may be expressed by 18*16+8*5=248. If the number of registers increases above a threshold (e.g., 200 registers), an area occupied by the registers may increase and routing may become increasingly complicated. Further, the number of registers may further increase to accommodate for burst length. The burst length may refer to a number of bits which may be consecutively input or output per data input/output pin in response to a write or read command. In a conventional memory device (e.g., DDR2), in which two bits of data may be input or output per data input/output pin during a single clock cycle, an address may be delayed by a clock cycle corresponding to "burst length/2", and therefore, at least a number of registers corresponding to the "burst length/2" may be required to output the single address signal. Accordingly, as the size of latency control circuit 1500 increases, a line or conductive path of a clock signal input to the latency control circuit 1500 may become longer, thereby increasing a delay time of the clock signal.

In order to quickly perform write and/or read operations, a semiconductor memory device, and particularly, a DRAM device, may perform a precharge operation for charging bit lines to a given voltage level to close an activated bank. The activated bank may be precharged before a new row in the activated bank may be opened. In other words, if data is written to or read from a memory cell through a bit line, the electric potential of the bit line may be changed. Accordingly, it may be necessary to precharge the bit line to the given voltage level after the data write or read operation.

A conventional precharge operation may be performed using a precharge command or an auto-precharge function. A precharge operation may also be performed after a write operation using a precharge command or an auto-precharge function. If the precharge command is issued after a write command to perform the precharge operation, a transmission efficiency of a data bus line may be decreased because an idle section (e.g., a portion on which no data may be transmitted through a bus line within a system) may occur. Accordingly, the auto-precharge function may typically be used to perform the precharge operation.

Typically, a write auto-precharge function may be performed in response to a write auto-precharge command, which may be defined by making a given signal (e.g., a bit A10 in an address signal), which may be input along with a write command applied from an external source (e.g., a memory controller), transition to the first logic level (e.g., a higher logic level or logic "1").

Thus, if the given signal (e.g., the bit A10 in the address signal) is set to the first logic level and received along with the write command, DRAM may internally generate a write auto-precharge command and may perform a write auto-precharge operation. The write command may be first executed based on the generated write auto-precharge command. The precharge operation may not be performed until the last data in a burst write sequence is stored in a memory array in response to the write command. After a given period of time following the last data being stored in the memory array, the precharge operation may be performed.

The given period of time may be a write recovery time tWR (e.g., a minimum "wait time" before data may be written to the memory cell). In an example, the write recovery time tWR may be fixed at about 15 ns. Accordingly, the precharge operation may be performed after the write recovery time tWR. The write auto-precharge command may thereby have to be delayed.

FIG. 25 illustrates a conventional auto-precharge control circuit 2100 which delays a write auto-precharge command by the write recovery time tWR.

Referring to FIG. 25, the auto-precharge control circuit 2100 may be a circuit for controlling an auto-precharge operation of DDR3 DRAM, which may include 8 banks and may have an operating frequency of 1.6 GHz. Accordingly, because a clock signal applied to the DDR3 DRAM may have a frequency of 800 GHz and a cycle of 1.25 ns, an auto-precharge command may be delayed by 12 clock cycles of the clock signal, which may correspond to 15 ns of the write recovery time tWR.

Referring to FIG. 25, the auto-precharge control circuit 2100 may include a precharge sub-signal generator 2110 and a precharge main signal generator 2120. The precharge sub-signal generator 2110 may include a decoder 2111 and an AND element array 2112. The decoder 2111 may output first precharge sub-signals BANK0 through BANK7, which may respectively correspond to 8 banks, based on bank address signals dBA0 through dBA2. The AND element array 2112 may include 8 AND elements connected in parallel and may perform an AND operation on each of the first precharge sub-signals BANK0 through BANK7 and a write auto-precharge command signal dWAP to output second precharge sub-signals FAP0 through FAP7.

Referring to FIG. 25, the precharge main signal generator 2120 may include a plurality of register arrays, which may respectively delay the second precharge sub-signals FAP0 through FAP7 output from the precharge sub-signal generator 2110 and may output precharge main signals PAPB0 through PAPB7 to the banks, respectively. The precharge operation may be performed based on the precharge main signals PAPB0 through PAPB7.

Referring to FIG. 25, in order to delay the second precharge sub-signals FAP0 through FAP7 by the write recovery time tWR, each of the register arrays may include 12 registers connected in series, which may respond to an internal clock signal PCLK.

Accordingly, referring to FIG. 25, the number of registers included within the auto-precharge control circuit 2100 may be 96, which may be obtained by multiplying the number of banks (i.e., 8) by the number of clock cycles of the internal clock signal PCLK (i.e., 12) corresponding to the write recovery time tWR (e.g., 15 ns). As described above, the number of registers may be related to the number of banks and the cycle of a clock signal. With the increase of an operating frequency and the decrease of a cycle of a clock signal in a memory device, the number of clock cycles of the internal clock signal PCLK, which corresponds to the write recovery time tWR, may be increased. As a result, the number of registers required to execute a write auto-precharge command may be increased.

As the number of registers is increased, as well as an area occupied by the registers in a layout, loading of the internal clock signal PCLK, which may be input to each register, may also be increased. As a result, a power consumption or current consumption may be increased.

SUMMARY OF THE INVENTION

An example embodiment of the present invention is directed to a latency control circuit, including a master unit activating at least one master signal based on a reference signal and an internal clock signal and a plurality of slave units receiving the at least one master signal and a plurality of signals, each of the plurality of slave units outputting an output signal based at least in part upon one of the received plurality of signals.

Another example embodiment of the present invention is directed to a method of controlling latency, including receiving at least one master signal, the received at least one master signal activated based on a reference signal and an internal clock signal and receiving a plurality of signals and outputting an output signal based at least in part upon one of the received plurality of signals and latency information.

Another example embodiment of the present invention is directed to an auto-precharge control circuit, including a precharge command delay unit generating a plurality of first precharge command delay signals in response to an internal clock signal and a write auto-precharge command signal, at least one bank address delay unit outputting a delayed bank address signal and a precharge main signal generator outputting a precharge main signal to banks based on the delayed bank address signal Another example embodiment of the present invention is directed to a latency control circuit and method for reducing a number of registers controlling latency, thereby decreasing routing complexity, a circuit area and delay of a clock signal.

Another example embodiment of the present invention is directed to a semiconductor memory device using the latency control circuit and a method of operating the semiconductor memory device.

Another example embodiment of the present invention is directed to an auto-precharge control circuit for reducing the number of registers to decrease an area occupied by the registers in a layout and to decrease loading of an internal clock signal, thereby reducing current consumption, and a semiconductor memory device including the same.

Another example embodiment of the present invention is directed to a method of controlling a precharging operation with an auto-precharge control circuit, including delaying a bank address signal based on a minimum time interval between executed memory commands and outputting a precharge main signal to one or more memory banks based on the delayed bank address signal.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

FIG. 5B is a signal timing chart illustrating an operation of the latency control circuit of FIG. 2 when the WL is 4 according to another example embodiment of the present invention.

FIG. 16A is a signal timing chart illustrating an operation of the latency control circuit of FIG. 15 when the WL is 7 and the BL is 4, according to another example embodiment of the present invention.

FIG. 16B is a signal timing chart illustrating an operation of the latency control circuit of FIG. 15 when the WL is 1 and the BL is 4 according to another example embodiment of the present invention.

DETAILED DESCRIPTION OF EXAMPLE EMBODIMENTS OF THE PRESENT INVENTION

Figure 1:
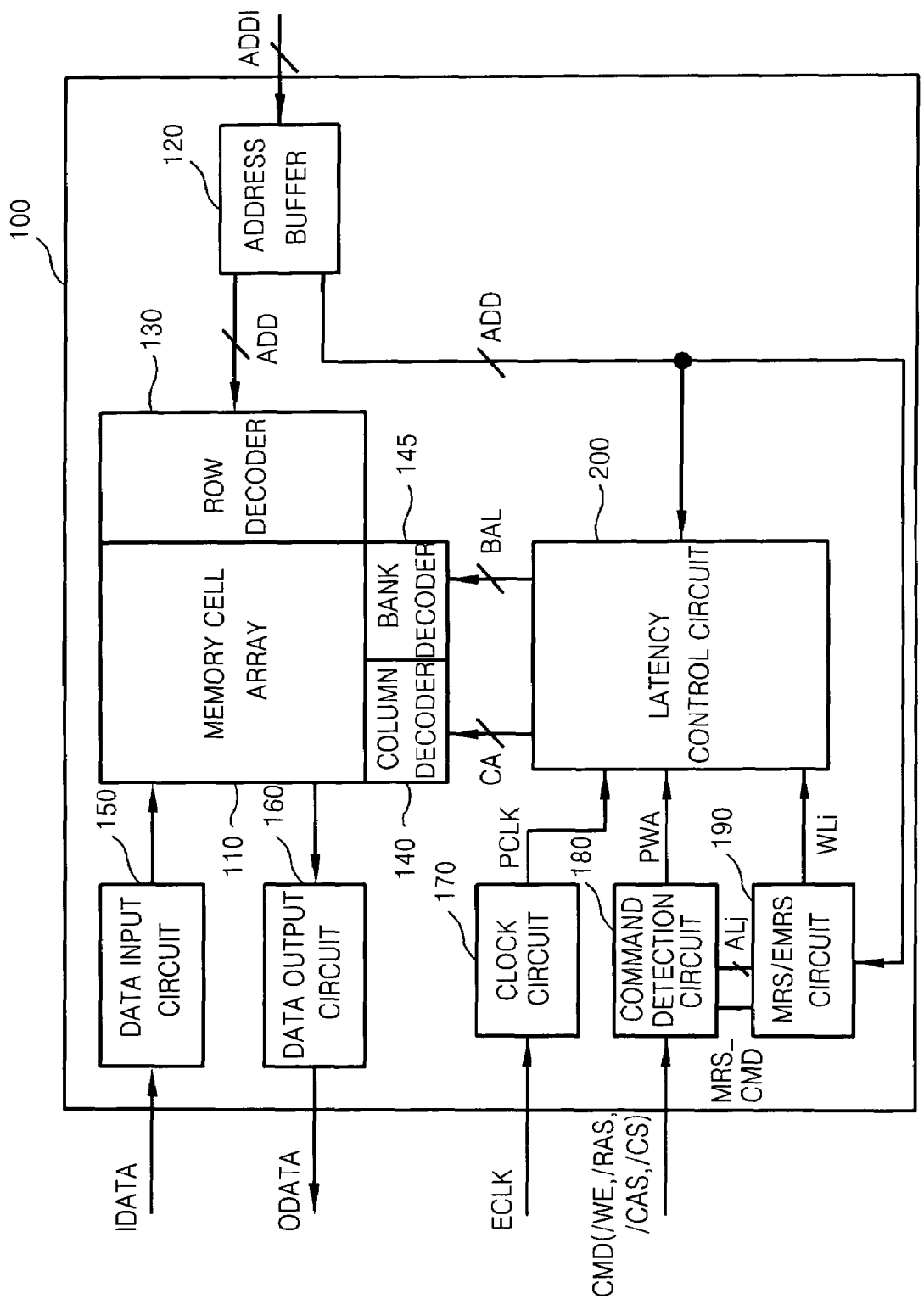
FIG. 1 is a block diagram of a semiconductor memory device according to an example embodiment of the present invention.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a semiconductor memory device 100 according to an example embodiment of the present invention. In the example embodiment of FIG. 1, the semiconductor memory device 100 may include a memory cell array 110, an address buffer 120, a row decoder 130, a column decoder 140, a bank decoder 145, a data input circuit 150, a data output circuit 160, a clock circuit 170, a command detection circuit 180, a Mode Register Set/Extended Mode Register Set (MRS/EMRS) circuit 190 and a latency control circuit 200.

In the example embodiment of FIG. 1, the memory cell array 110 may be a data storage in which numerous memory cells may be arranged in rows and columns. Input data IDATA input through the data input circuit 150 may be written to the memory cell array 110 based on an address signal ADDI. Output data ODATA read from the memory cell array 110 based on the address signal ADDI may be output through the data output circuit 160 to an external entity. To designate a memory cell to or from which data may be written or read, the address signal ADDI may be input to the address buffer 120. The address buffer 120 may temporarily store the address signal ADDI input from the external entity. The row decoder 130 may receive the address signal ADD output from the address buffer 120 and may decode the address signal ADD into a row address of the memory cell array 110. The column decoder 140 may receive a column address signal CA output from the latency control circuit 200 and may decode the column address signal CA into a column address of the memory cell array 110. The bank decoder 145 may receive a bank address signal BAL output from the latency control circuit 200 and may decode the bank address signal BAL into a bank address designating a memory bank. The memory cell array 110 may read data from or may write data into a memory cell designated by the row address and the column address in a memory bank designated by the bank address.

In the example embodiment of FIG. 1, the clock circuit 170 may receive an external clock signal ECLK and may generate an internal clock signal PCLK from the external clock signal ECLK. In an example, the internal clock signal PCLK may be obtained by buffering the external clock signal ECLK.

In the example embodiment of FIG. 1, the command detection circuit 180 may receive a command signal CMD (e.g., /WE, /CS, /RAS, /CAS, etc.) from an external entity and may decode the command signal CMD to output a decoded command signal (e.g., a write command signal PWA). Although not shown in the example embodiment of FIG. 1, the command detection circuit 180 may further include a command buffer and a command decoder. In another example, the command detection circuit 180 may further include a latency control circuit in order to delay the command signal CMD by a number of clock cycles corresponding to an additive latency (AL). The decoded command signal (e.g., the write command signal PWA) may be output from the command detection circuit 180.

In the example embodiment of FIG. 1, the MRS/EMRS circuit 190 may set an internal mode register in response to an MRS/EMRS command MRS_CMD and/or the address signal ADD for designating an operating mode of the semiconductor memory device 100. Input latency (e.g., write latency (WL), AL, etc.) may be set by the MRS/EMRS command MRS_CMD in the mode register. The MRS/EMRS circuit 190 may output a WL signal WLi (e.g., wherein "i" may be a positive integer) based on WL information and may output an AL signal ALj (e.g., wherein "j" may be a positive integer) based on AL information.

In the example embodiment of FIG. 1, the latency control circuit 200 may receive the WL signal WLi from the MRS/EMRS circuit 190 and the address signal ADD from the address buffer 120 and may control the column address signal CA and the bank address signal BAL so as to be generated at a given time (e.g., after a given delay period) based on the WL signal WLi. The latency control circuit 200 may further receive the AL signal ALj from the MRS/EMRS circuit 190 and may control a given time when the column address signal CA and the bank address signal BAL are generated based on the WL signal WLi and the AL signal ALj.

Figure 2:
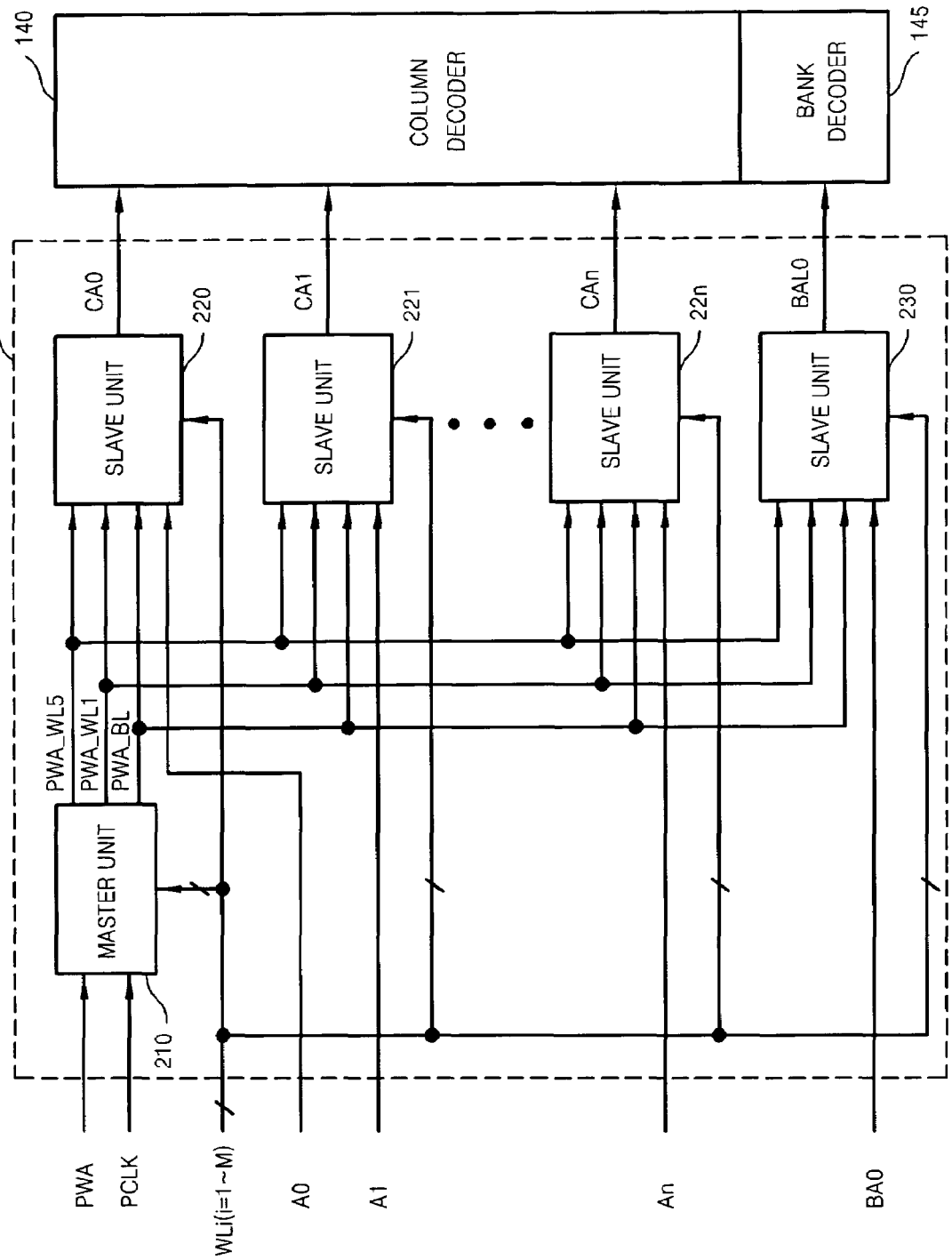
FIG. 2 is a block diagram of the latency control circuit according to another example embodiment of the present invention.

FIG. 2 is a block diagram of the latency control circuit 200 according to another example embodiment of the present invention. In the example embodiment of FIGS. 1 and 2, the latency control circuit 200 may include a master unit 210 and a plurality of slave units 220, 221, 22n and 230. The latency control circuit 200 may control a time at which the column address signal CA and the bank address signal BAL may be generated based on latency information, such as the WL signal WLi. Thus, in an example, the latency control circuit 200 may delay an address signal by a number of clock cycles corresponding to the latency information based on when the write command signal PWA is activated to control a generation time or activation time of a column address and a bank address.

In the example embodiment of FIG. 2, the master unit 210 may generate master signals PWA_WL5, PWA_WL1 and PWL_BL in response to the internal clock signal PCLK, the write command signal PWA and the WL signal WLi. The write command signal PWA may be generated by the command detection circuit 180 in response to an external write command.

Figure 3:
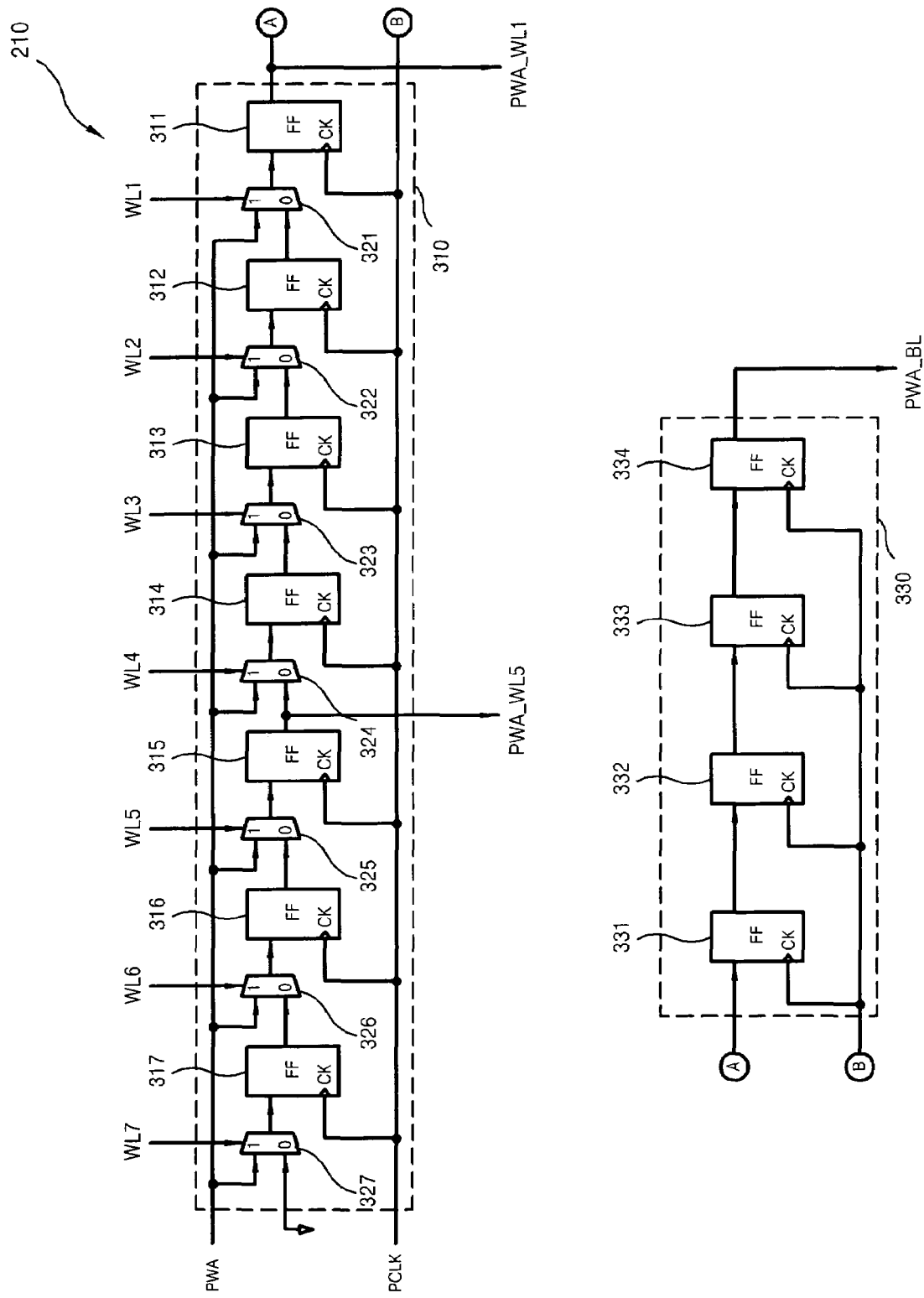
FIG. 3 is a circuit diagram of a master unit according to another example embodiment of the present invention.

FIG. 3 is a circuit diagram of the master unit 210 of FIG. 2 according to another example embodiment of the present invention. In the example embodiment of FIG. 3, the master unit 210 may include a write master signal generator 310 and a burst master signal generator 330.

In the example embodiment of FIG. 3, the write master signal generator 310 may include a plurality of registers 311 through 317 and a plurality of multiplexers 321 through 327, which may be connected in cascade or series. In an example, each of the registers 311 through 317 may be implemented by a flip-flop. The number of flip-flops included in the write master signal generator 310 may be determined by a maximum value of the WL. For example, if the maximum value of the WL is M, where M may equal a natural number (e.g., a positive integer greater than or equal to 1), the write master signal generator 310 may include M flip-flops. As described hereinafter, for purposes of description, within the example embodiment of FIG. 3, it may be assumed that the maximum value of the WL may equal 7 (e.g., M=7) and a burst length may have a value of 8. However, it is understood that other example embodiments may include a maximum value of the WL other than 7.

In the example embodiment of FIG. 3, the internal clock signal PCLK may be input through a clock terminal CK into each of the flip-flops 311 through 317. Each of the multiplexers 321 through 326 may select and output one of an output signal of a preceding flip-flop and the write command signal PWA in response to the corresponding WL signal WLi (e.g., wherein I=1 through M), which may be output from the MRS/EMRS circuit 190 based on WL. For example, if WL equals 7, a WL signal WL7 may be activated (e.g., set to the first logic level, such as a higher logic level or logic "1") and the remaining signals WLi (i=1, 2, 3, 4, 5, 6) may be deactivated (e.g., set to the second logic level, such as a lower logic level or logic "0".)

In the example embodiment of FIG. 3, each of the first through sixth multiplexers 321 through 326 may select and output the write command signal PWA if the corresponding WL signal WLi (e.g., i=1~6) is activated and may alternatively select and output an output signal of the preceding flip-flop if the corresponding WL signal WLi (i=1~6) is deactivated. The seventh multiplexer 327 may select and output the write command signal PWA if the corresponding WL signal WL7 is activated and may alternatively output the second logic level (e.g., a lower logic level or logic "0") if the WL signal WL7 is deactivated.

In the example embodiment of FIG. 3, each of the flip-flops 311 through 317 may output an input signal in synchronization with the internal clock signal PCLK. For example, an output signal of the first flip-flop 311 may be referred to as a first write master signal PWA_WL1 and an output signal of the fifth flip-flop 315 may be referred to as a second write master signal PWA_WL5, and so on.

In the example embodiment of FIG. 3, the write master signal generator 310 may delay the write command signal PWA by a given delay period (e.g., an integer multiple of the internal clock signal PCLK in integer multiples of single clock cycle of the internal clock signal PCLK) and may output a given signal among delayed signals as the write master signal PWA_WL1 or PWA_WL5. The write master signals PWA_WL1 and PWA_WL5 may have an interval of tCCD therebetween. In an example, the tCCD may be a CAS to CAS command delay and may be indicative of a minimum interval between commands in the number of clock cycles tCK. In an example, the CAS to CAS command delay tCCD may be determined before semiconductor devices are manufactured and may be equal to (BL/2), where BL is a burst length. The single clock cycle tCK may be used as a unit indicating a number of clock cycles in the internal clock signal PCLK. In other words, 1 tCK may indicate one clock cycle of the internal clock signal PCLK.

In the example embodiment of FIG. 3, if the WL is 7, the write command signal PWA may be input into the seventh flip-flop 317 as an input signal and may thereafter sequentially pass through the sixth, fifth, fourth, third, second, and first flip-flops 316, 315, 314, 313, 312, 312, and 313, respectively. As a result, the write command signal PWA may be delayed by about 3 tCK, thereby generating the second write master signal PWA_WL5, and the write command signal PWA may be delayed by the number of clock cycles corresponding to the WL (e.g., 7 tCK or clock cycles), thereby generating the first write master signal PWA_WL1.

In the example embodiment of FIG. 3, if the WL is 6, the write command signal PWA may be input into the sixth flip-flop 316 as an input signal and may thereafter sequentially pass through the fifth, fourth, third, second, and first flip-flops 315, 314, 313, 312, 312, and 313, respectively. As a result, the write command signal PWA may be delayed by about 2 tCK or clock cycles, thereby generating the second write master signal PWA_WL5, and the write command signal PWA may be delayed by the number of clock cycles corresponding to the WL (e.g., 6 tCK or clock cycles), thereby generating the first write master signal PWA_WL1.

In the example embodiment of FIG. 3, if the WL is set to another value (e.g., 5, 4, 3, 2, or 1, a value other than 6 or 7, etc.), the write master signal generator 310 may operate in the same manner as above described with respect to when WL equals 7 or 6. However, if the WL is 4, 3, 2, or 1, because the write command signal PWA is input into the fourth, third, second, or first flip-flop 314, 313, 312, or 311, the second write master signal PWA_WL5 may not be generated, or activated (e.g., set to the first logic level, such as a higher logic level or logic "1"), but rather only the first write master signal PWA_WL1 may be generated, or activated.

In the example embodiment of FIG. 3, the burst master signal generator 330 may include one or more registers 331 through 334. In an example, the registers 331 through 334 may be implemented by flip-flops. The number of flip-flops included in the burst master signal generator 330 may be determined by the burst length (BL). In an example, the number of flip-flops may be (BL/2). In another example, BL may equal 8, and therefore, the number of flip-flops included in the burst master signal generator 330 may be 4 (e.g., because 8/2=4). Thus, the registers 331 through 334 may be referred to as eighth through eleventh flip-flops 331 through 334. The internal clock signal PCLK may be input through a clock terminal CK into each of the eighth through eleventh flip-flops 331 through 334.

In the example embodiment of FIG. 3, the eighth through eleventh flip-flops 331 through 334 may be connected in series and each may receive an output signal of a previous or preceding flip-flop. Thus, the eighth flip-flop 331 may receive an output signal of the first flip-flop 311 (e.g., the first write master signal PWA_WL1). Likewise, the ninth flip-flop 332 may receive an output signal of the eighth flip-flop 331, the tenth flip-flop 333 may receive an output signal of the ninth flip-flop 332, the eleventh flip-flop 334 may receive an output signal of the tenth flip-flop 333, and so on. In an example, an output signal of the eleventh flip-flop 334 may be output as a burst master signal PWA_BL.

In the example embodiment of FIG. 3, the burst master signal generator 330 may delay a final output signal of the write master signal generator 310 (e.g., the first write master signal PWA_WL1) by a number of clock cycles equal to (BL/2), thereby outputting the burst master signal PWA_BL. Consequently, the burst master signal generator 330 may further delay by (BL/2) the write command signal PWA that has been delayed by the WL.

Figure 4:
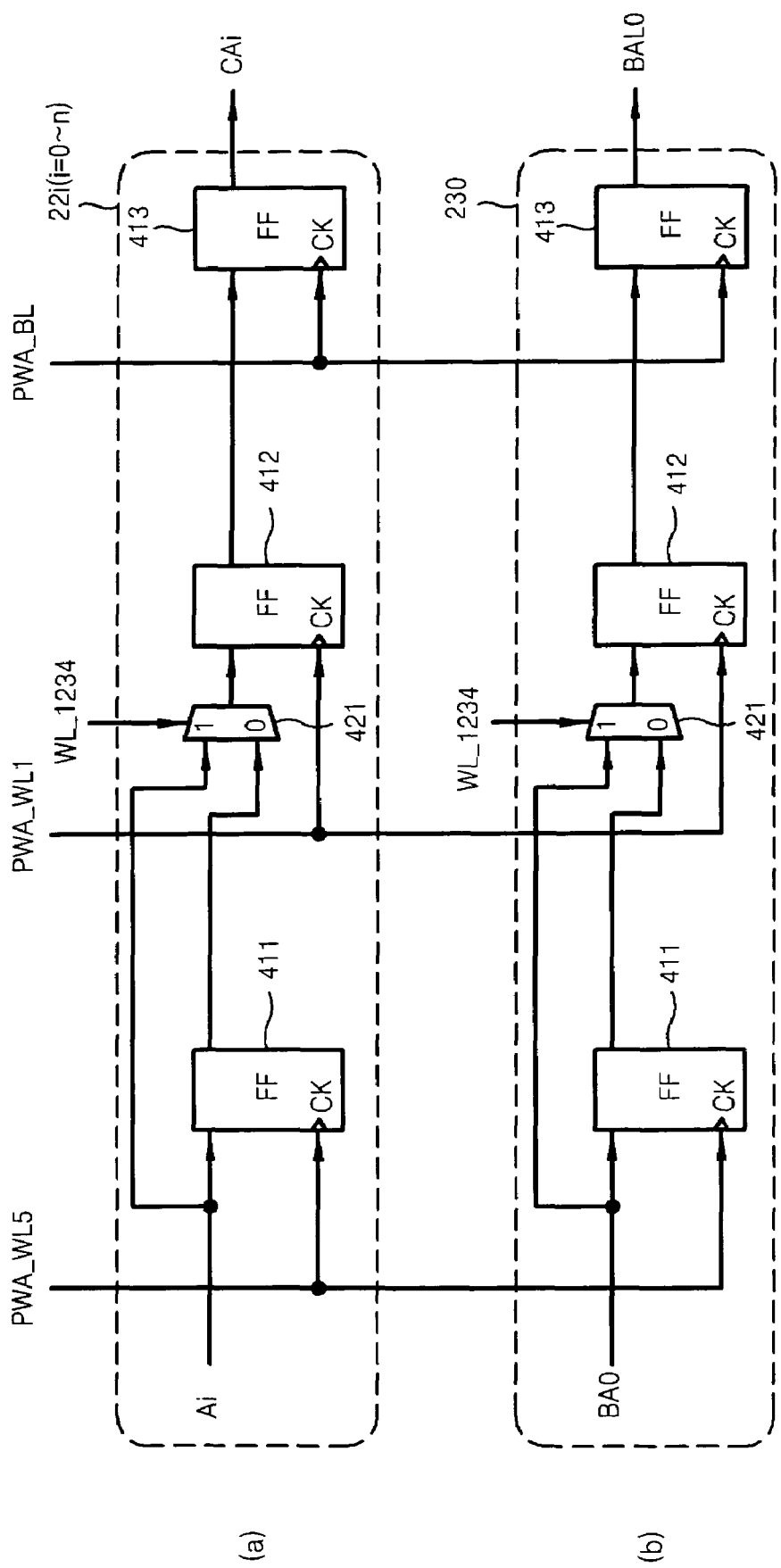
FIG. 4 is a circuit diagram of slave units according to another example embodiment of the present invention.

FIG. 4 is a circuit diagram of the slave units 22i and 230 of FIG. 2 according to another example embodiment of the present invention. In an example, the slave unit 22i may be representative of any number of slave units, wherein i may equal 0, 1, . . . , n. Thus, while FIG. 4 illustrates only the slave unit 22i for a column address signal and the slave unit 230 for a bank address signal, additional slave units may be added as the number of bits in the column address signal and/or the bank address signal increases. The address signal ADD may include a column address signal A and a bank address signal BA.

In the example embodiment of FIG. 4, the column address signal A and the bank address signal BA may be output signals of the address buffer 120 shown in FIG. 1, or alternatively, may be signals obtained by latching, sampling and/or delaying the output signals of the address buffer 120.

In the example embodiment of FIG. 4, a suffix "i" or numeral added to an address signal A, BA, CA, or BAL may denote a particular bit within the address signal. While the example embodiment of FIG. 4 illustrates one-bit bank address signal BA0, it is understood that a bank address signal may include a plurality of bits in other example embodiments of the present invention. Accordingly, a total number of slave units may be the sum of the number of bits in a column address and the number of bits in a bank address.

In the example embodiment of FIG. 4, each of the slave units 22i and 230 may generate a delay address bit signal corresponding to one "random" bit (e.g., any one of the bits) in the address signal in response to a plurality of master signals (e.g., three master signals PWA_WL5, PWA_WL1, and PWA_BL) output from the master unit 210. The slave units 22i and 230 may generally have the same structure and operation, with the exception that the slave unit 22i may receive one "random" bit signal Ai (e.g., wherein I=0~n) of a column address signal and may delay the signal Ai based on WL, thereby generating a delayed column address bit signal CAi, while the slave unit 230 may receive one random bit signal BA0 of a bank address signal and may delay the signal BA0 based on input latency, thereby generating a delay bank address signal BAL0.

In the example embodiment of FIG. 4, the slave unit 22*i* for the column address signal may include a plurality of flip-flops (e.g., three flip-flops 411, 412, and 413) and a multiplexer 421. The first flip-flop 411 may receive the second write master signal PWA_WL5 through a clock terminal CK and the column address bit signal Ai through an input terminal. Accordingly, the first flip-flop 411 may output an input signal in response to the second write master signal PWA_WL5. The second flip-flop 412 may receive the first write master signal PWA_WL1 through a clock terminal CK and an output signal of the multiplexer 421 through an input terminal. The multiplexer 421 may select and output one of the column bit address signal Ai and an output signal of a previous or preceding flip-flop (e.g., the first flip-flop 411) in response to a write latency code signal WL_1234. The write latency code signal WL_1234 may be activated (e.g., set to the first logic level, such as a higher logic level or logic "1") if the input latency is 1 through 4 and may be deactivated (e.g., set to the second logic level, such as a lower logic level or logic "0") if the input latency is 5 or greater. Consequently, the second flip-flop 412 may receive the output signal of the multiplexer 421 as an input signal and may output the received input signal in response to the first write master signal PWA_WL1. The third flip-flop 413 may receive the burst master signal PWA_BL through a clock terminal CK and an output signal of the second flip-flop 412 through an input terminal. Accordingly, the third flip-flop 413 may output an input signal in response to the burst master signal PWA_BL. An output signal of the third flip-flop 413 may be the delayed column address bit signal CAi.

In the example embodiment of FIG. 4, the structure and operation of the slave unit 230 for the bank address signal may be the same as that of the slave unit 22*i* for the column address signal. Thus, a detailed description thereof will be omitted for the sake of brevity.

In the example embodiment of FIG. 4, the slave unit 22*i* and/or 230 may receive the column or bank address signal Ai or BA0 and may sequentially latch the address signal Ai and/or BA0 in response to the master signals PWA_WL5, PWA_WL1, and PWA_BL, which may be sequentially activated (e.g., set to the first logic level, such as a higher logic level or logic "1") by the master unit 210, thereby outputting the address signal Ai or BA0 that has been delayed by (WL+BL/2).

Figure 5A:
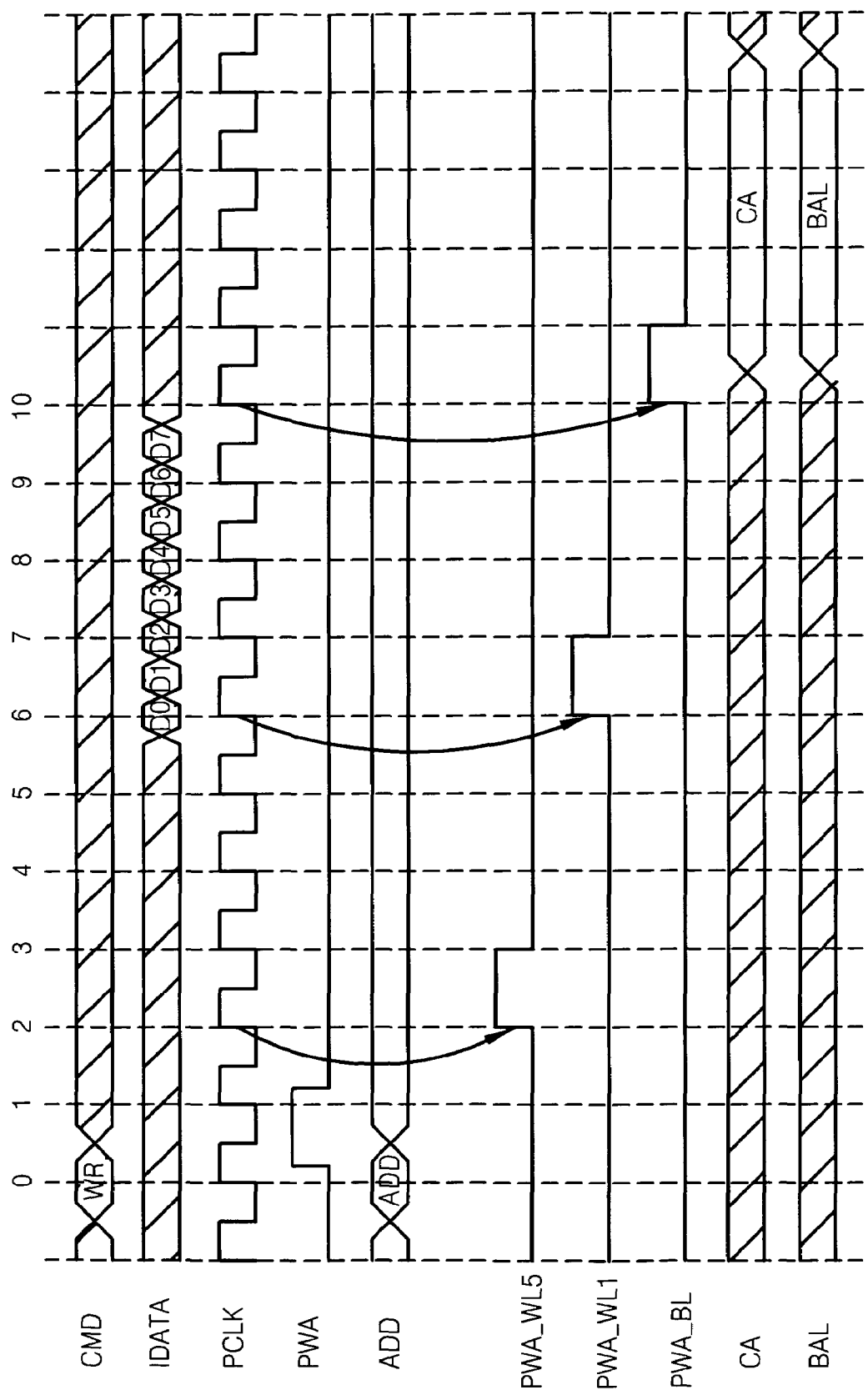
FIG. 5A is a signal timing chart illustrating an operation of the latency control circuit of FIG. 2 when the WL is 6 according to another example embodiment of the present invention.

FIG. 5A is a signal timing chart illustrating an operation of the latency control circuit 200 of FIG. 2 when the WL is 6 according to another example embodiment of the present invention. FIG. 5B is a signal timing chart illustrating an operation of the latency control circuit 200 of FIG. 2 when the WL is 4 according to another example embodiment of the present invention. FIGS. 5A and 5B illustrate signals transitions during a progression of clock signals, which are shown as a series of time units from time 0 to time 10.

In the example embodiments of FIGS. 5A and 5B, if a write command WR is input from an external entity at time 0, the write command signal PWA may be generated. In addition, the address signal ADD designating a memory cell to which input data D0 through D7 may be written may also be input along with the write command WR. After the write command WR is input at the time 0, another command may be input at an interval of tCCD. However, the descriptions of FIGS. 5A and 5B are given below with respect to a single write command WR input at the time 0 for the sake of clarity.

Example operation of the latency control circuit 200 performed when the WL equals 6 and tCCD is 4 tCK will now be described with reference to FIGS. 3, 4 and 5A below.

In example operation of the latency control circuit 200 when the WL equals 6, with reference to FIGS. 3, 4 and 5A, in the write master signal generator 310 included in the master unit 210, because WL is 6, the latency signal WL6 may be activated (e.g., set to the first logic level) and the remaining latency signals WLi (where i=1, 2, 3, 4, 5, 7) may be deactivated (e.g., set to the second logic level). Accordingly, the sixth multiplexer 326 may select and output the write command signal PWA and the remaining multiplexers 325 through 321 may select and output the output signals of the previous or preceding flip-flops 316 through 312, respectively. As a result, the write command signal PWA may be input to the sixth flip-flop 316 and then output in synchronization with the internal clock signal PCLK. The fifth multiplexer 325 may select and output the output signal of a preceding flip-flop (e.g., the sixth flip-flop 316), and therefore, the fifth flip-flop 315 may receive the output signal of the sixth flip-flop 316. The fifth flip-flop 315 may output the input signal in response to the internal clock signal PCLK. The other multiplexers 324, 323, 322, and 321 may select and output the output signals of their preceding flip-flops, respectively, and therefore, the flip-flops 324 through 321 may also receive the output signals of their previous flip-flops, respectively, and may output their input signals in response to the internal clock signal PCLK. The output signal of the fifth flip-flop 315 may be output as the second write master signal PWA_WL5 and the output signal of the first flip-flop 311 may be output as the first write master signal PWA_WL1. Accordingly, the second write master signal PWA_WL5 may be generated if the write command signal PWA is delayed by about 2 tCK and the first write master signal PWA_WL1 may be generated if the write command signal PWA is delayed by a number of clock cycles corresponding to the WL (e.g., in this example, by about 6 tCK because WL equals 6).

In example operation of the latency control circuit 200 when the WL equals 6, with reference to FIGS. 3, 4 and 5A, the burst master signal generator 330 may delay the final output signal of the write master signal generator 310 (e.g., the first write master signal PWA_WL1) by 4 tCK, thereby outputting the burst master signal PWA_BL.

In example operation of the latency control circuit 200 when the WL equals 6, with reference to FIGS. 3, 4 and 5A, in the slave units 22*i* and 230, the address signal ADD (e.g., including the column and bank address signals A and BA) may be output in response to the second write master signal PWA_WL5. The, the address signal ADD, output in response to the second write master signal PWA_WL5, may be output in response to the first write master signal PWA_WL1. The address signal ADD, output in response to the first write master signal PWA_WL1, may be output in response to the burst master signal PWA_BL, thereby generating the delayed column and bank address signals CA and BAL. Accordingly, the delayed column and bank address signals CA and BAL may be generated after (WL+BL/2) tCK (e.g., 10 tCK or time 10) after the input time 0 of the address signal ADD.

Example operation of the latency control circuit 200 performed when the WL equals 4 and tCCD is 4 tCK will now be described with reference to FIGS. 3, 4 and 5B below.

In example operation of the latency control circuit 200 when the WL equals 4, with reference to FIGS. 3, 4 and 5B, in the write master signal generator 310 included in the master unit 210, the latency signal WL4 may be activated (e.g., set to the first logic level) and the remaining latency signals WLi (where i=1, 2, 3, 5, 6, 7) may be deactivated (e.g., set to the second logic level). Accordingly, the fourth multiplexer 324 may select and output the write command signal PWA. The write command signal PWA may sequentially pass through the third, second, and first flip-flops 323, 322, and 321. Thus, the write command signal PWA may be latched by the fourth flip-flop 324, an output signal of the fourth flip-flop 324 may be latched by the third flip-flop 323, an output signal of the third flip-flop 323 may be latched by the second flip-flop 322 and an output signal of the second flip-flop 322 may be latched by the first flip-flop 321. Accordingly, an output signal of the fifth flip-flop 325 (e.g., the second write master signal PWA_WL5) may not be activated (e.g., thereby remaining at the second logic level). In addition, the output signal of the first flip-flop 321 (e.g., the first write master signal PWA_WL1) may be generated after a number of clock cycles corresponding to WL (e.g., 4 tCK or clock cycles) because the write command signal PWA may be input to the write master signal generator 310.

In example operation of the latency control circuit 200 when the WL equals 4, with reference to FIGS. 3, 4 and 5B, the burst master signal generator 330 may delay the final output signal of the write master signal generator 310 (e.g., the first write master signal PWA_WL1) by 4 tCK, thereby outputting the burst master signal PWA_BL.

In example operation of the latency control circuit 200 when the WL equals 4, with reference to FIGS. 3, 4 and 5B, in the slave units 22i and 230, the address signal ADD, including the column and bank address signals A and BA, may be output in response to the first write master signal PWA_WL1. The address signal ADD, output in response to the first write master signal PWA_WL1, may be output in response to the burst master signal PWA_BL, thereby generating the delayed column and bank address signals CA and BAL. Accordingly, the delayed column and bank address signals CA and BAL may be generated after (WL+BL/2) tCK (e.g., 8 tCK or clock cycles) following the input time 0 of the address signal ADD. A plurality of delayed column and bank address signals CA and BAL may be generated at an interval of tCCD (e.g., 4 tCK).

In the above-described example operation of FIGS. 5A and 5B, tCCD=4 and BL=8. However, it is understood that other example embodiments of the present invention may be directed to the master unit 210 and the slave units 22i and 230 configured for operation with any value of tCCD and/or BL.

Figure 6:
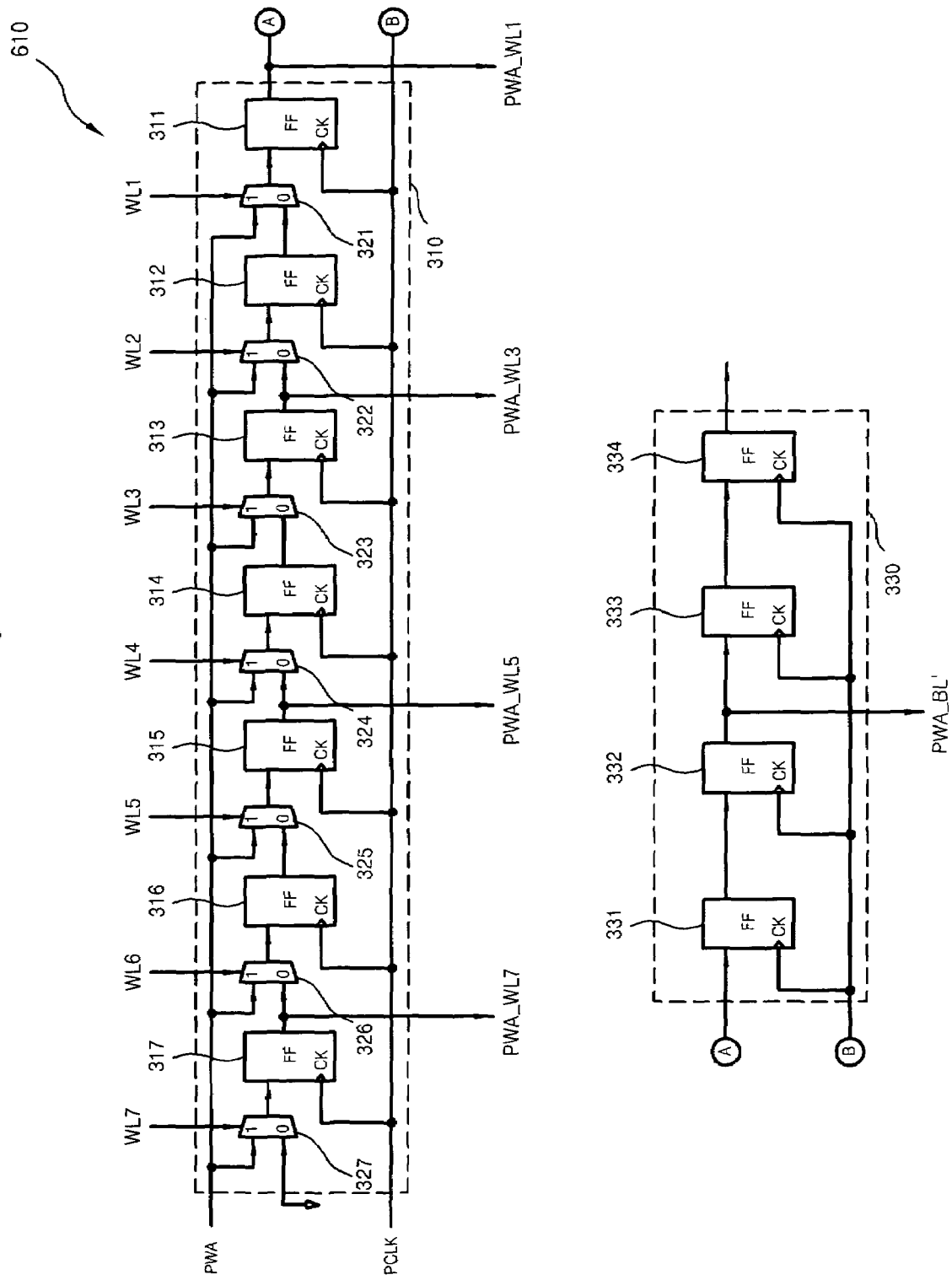
FIGS. 6 and 7 are circuit diagrams illustrating a master unit and a slave unit, respectively, according to another example embodiment of the present invention.
Figure 7:
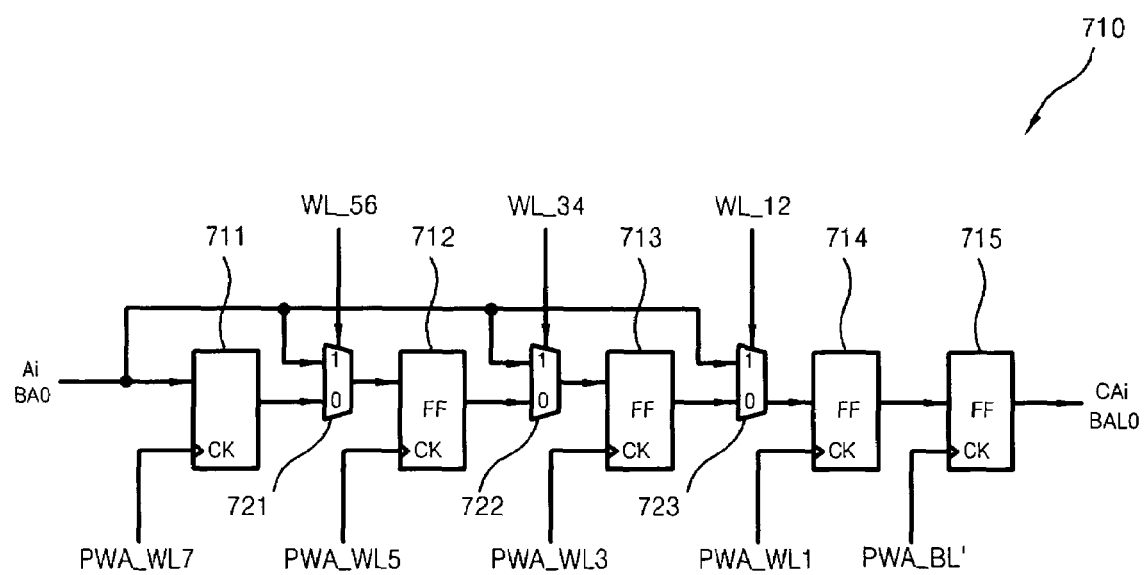

FIGS. 6 and 7 are circuit diagrams illustrating a master unit 610 and a slave unit 710, respectively, according to another example embodiment of the present invention. In the example embodiments of FIGS. 6 and 7, an example wherein tCCD=2 and BL=4 may be illustrated, while it is understood that other example embodiments of the present invention need not be limited to structures configured for operation with such values.

In the example embodiment of FIG. 6, the master unit 610 may have a structure and operation similar to the master unit 210 illustrated in FIG. 3. However, the master unit 610 may output additional write master signals PWA_WL7 and PWA_WL3 such that an interval between write master signals may be an integer multiple of tCCD (e.g., 2 tCK). In addition, because BL=4, a burst master signal PWA_BL' may be output after BL/2 clock cycles (i.e., 2 tCK) following the output of the first write master signal. Accordingly, an output signal of the ninth flip-flop 332 may be output as the burst master signal PWA_BL'. Thus, the tenth and eleventh flip-flops 333 and 334 need not be included.

In the example embodiment of FIG. 7, the slave unit 710 may further include flip-flops 711 and 713 responding to the additional write master signals PWA_WL7 and PWA_WL3, as compared to the slave units 22i and 230 illustrated in FIG. 4. The slave unit 710 may include flip-flops 711 through 715 responding to the five master signals PWA_WL7, PWA_WL5, PWA_WL3, PWA_WL1, and PWA_BL', respectively, output from the master unit 610. The slave unit 710 may further include multiplexers 721 through 723.

In the example embodiment of FIG. 7, each of the multiplexers 721 through 723 may select and output one of an output signal of a previous or preceding flip-flop and the address signal (Ai+BA0) in response to a corresponding WL code signal WL_56, WL_34 and/or WL_12. The WL code signals WL_56, WL_34 and WL_12 may be activated (e.g., set to the first logic level) based on WL information. For example, if the WL is 1 or 2, the WL code signal WL_12 may be activated. Alternatively, if the WL is 3 or 4, the WL code signal WL_34 may be activated. In another alternative example, if the WL is 5 or 6, the WL code signal WL_56 may be activated. Accordingly, if the WL is 1 or 2, the address signal Ai or BA0 may be sequentially delayed by the flip-flops 714 and 715 and then output as the delayed column or bank address signal CAi or BAL0. If the WL is 3 or 4, the address signal Ai or BA0 may be sequentially delayed by the flip-flops 713, 714, and 715 and then output as the delayed column or bank address signal CAi or BAL0, and so on.

In the example embodiment of FIG. 7, the slave unit 710 may receive the column or bank address signal Ai or BA0 and may sequentially latch and output the received column/bank address signal Ai/BA0 in response to a master signal activated among the master signals PWA_WL7, PWA_WL5, PWA_WL3, PWA_WL1, and PWA_BL' may be sequentially output from the master unit 610. As a result, the slave unit 710 may output the received address signals Ai and BA0 after delaying them by (WL+BL/2) clock cycles.

Figure 8:
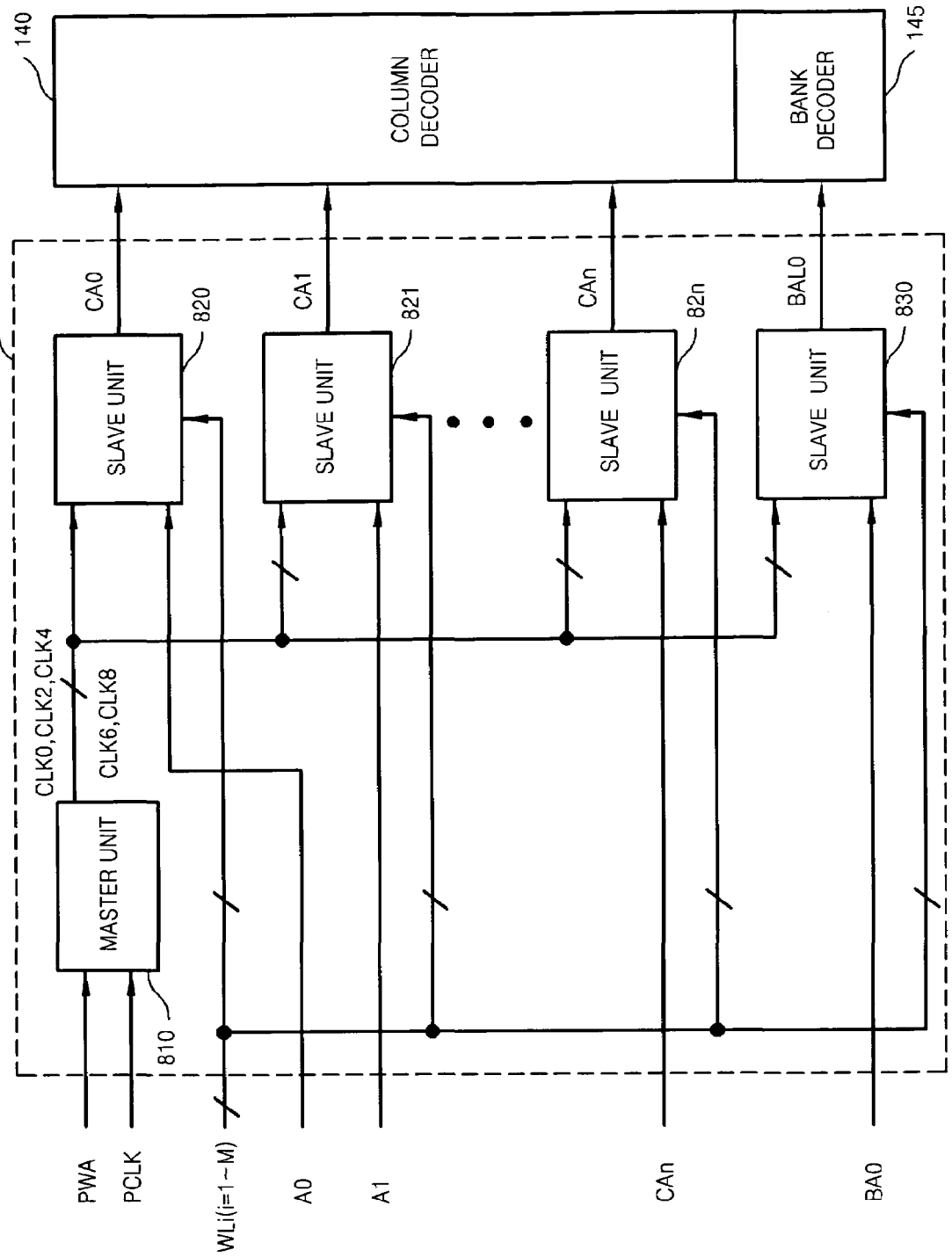
FIG. 8 is a block diagram of another latency control circuit according to another example embodiment of the present invention.

FIG. 8 is a block diagram of a latency control circuit 200' according to another example embodiment of the present invention. In the example embodiment of FIG. 8, similar to the latency control circuit 200 illustrated in FIG. 2, the latency control circuit 200' may include a master unit 810 and a plurality of slave units 82i and 830 (e.g., wherein I=0~n) and may control a generation time of the column address signal CA and the bank address signal BAL based on the WL signal WLi (e.g., wherein i may be a positive integer).

Figure 9:
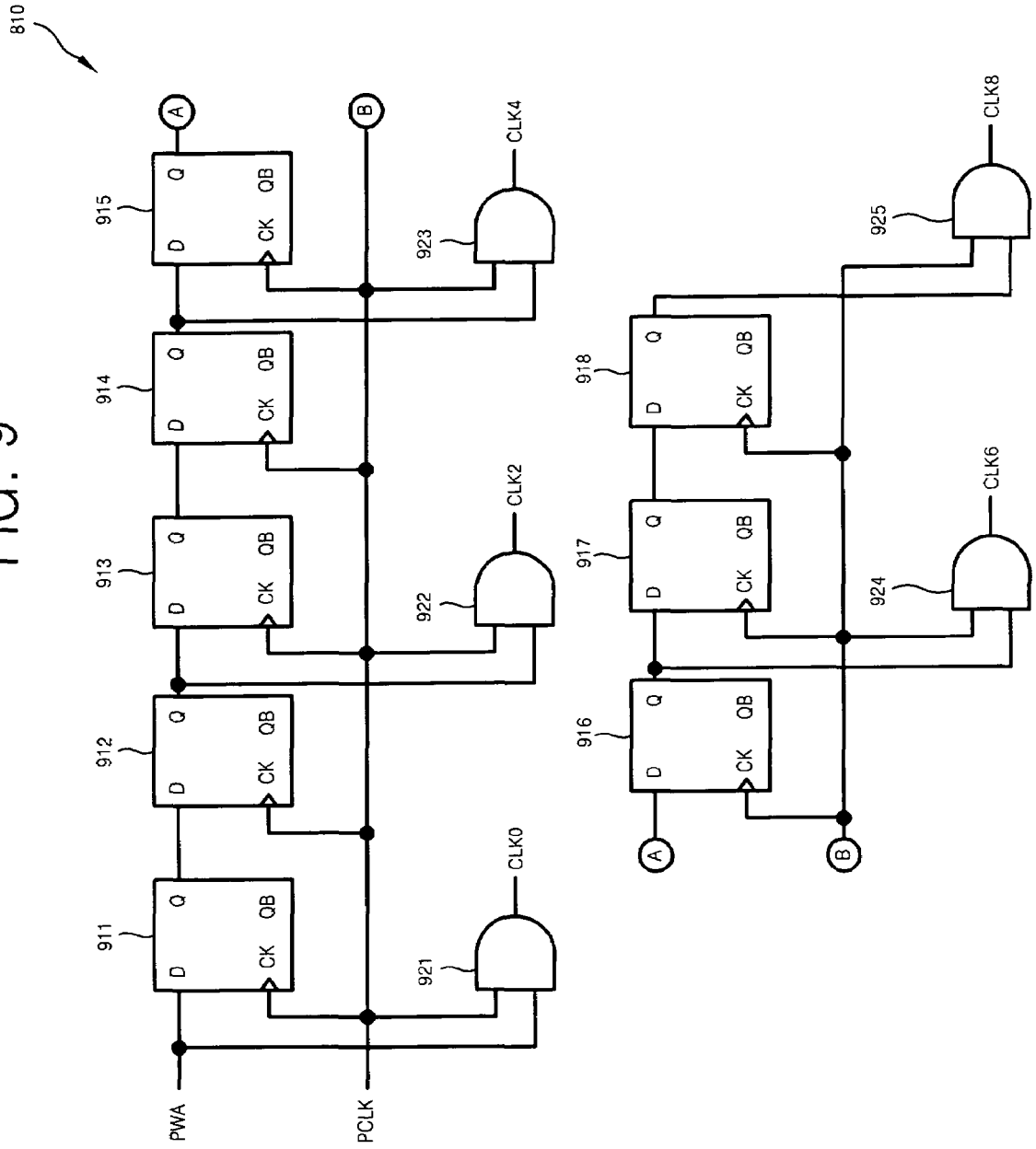
FIG. 9 is a circuit diagram of the master unit of FIG. 8 according to another example embodiment of the present invention.

FIG. 9 is a circuit diagram of the master unit 810 of FIG. 8 according to another example embodiment of the present invention. In the example embodiment of FIG. 9, the master unit 810 may include a plurality of registers 911 through 918 connected in series and a plurality of combiners 921 through 925. In an example, each of the registers 911 through 918 may be implemented by a flip-flop and each of the combiners 921 through 925 may be implemented by an AND gate. Thus, for clarity of the description, the flip-flops (e.g., registers 911 through 918) may be referred to as first through eighth flip-flops 911 through 918 and the AND gates may be referred to as first through fifth AND gates 921 through 925.

In the example embodiment of FIG. 9, the first through eighth flip-flops 911 through 918 may be connected in series and may receive the internal clock signal PCLK through their clock terminals CK. The first flip-flop 911 may receive the write command signal PWA as an input signal and the second through eighth flip-flops 912 through 918 may receive output signals, respectively, of previous or preceding flip-flops (e.g., among the flip-flops 911 through 918), as input signals. The first through eighth flip-flops 911 through 918 may output their respective input signals in synchronization with the internal clock signal PCLK. Accordingly, the first through eighth flip-flops 911 through 918 may generate write command signals delayed by 1 through 8 tCK, respectively.

In the example embodiment of FIG. 9, the first AND gate 921 may perform an AND operation on the write command signal PWA and the internal clock signal PCLK, thereby generating a first master signal CLK0. The second AND gate 922 may perform an AND operation on an output signal of the second flip-flop 912 (e.g., a 2 tCK delayed write command signal) and the internal clock signal PCLK, thereby generating a second master signal CLK2. The third AND gate 923 may perform an AND operation on an output signal of the fourth flip-flop 914 (e.g., a 4 tCK delayed write command signal) and the internal clock signal PCLK, thereby generating a third master signal CLK4. The fourth AND gate 924 may perform an AND operation on an output signal of the sixth flip-flop 916 (e.g., a 6 tCK delayed write command signal) and the internal clock signal PCLK, thereby generating a fourth master signal CLK6. The fifth AND gate 925 may perform an AND operation on an output signal of the eighth flip-flop 918 (e.g., an 8 tCK delayed write command signal) and the internal clock signal PCLK, thereby generating a fifth master signal CLK8.

In the example embodiment of FIG. 9, the master unit 810 may delay the write command signal PWA by integer multiples of the internal clock signal PCLK (e.g., integer multiples of a clock cycle) and may output a given signal among the delayed signals as a master signal. "Master signals" may be output at an interval of an integer multiple of tCCD. In an example, the tCCD may be 2, and therefore, the first through fifth master signals CLK0, CLK2, CLK4, CLK6 and CLK8 may have an interval of 2 tCK.

Figure 10:
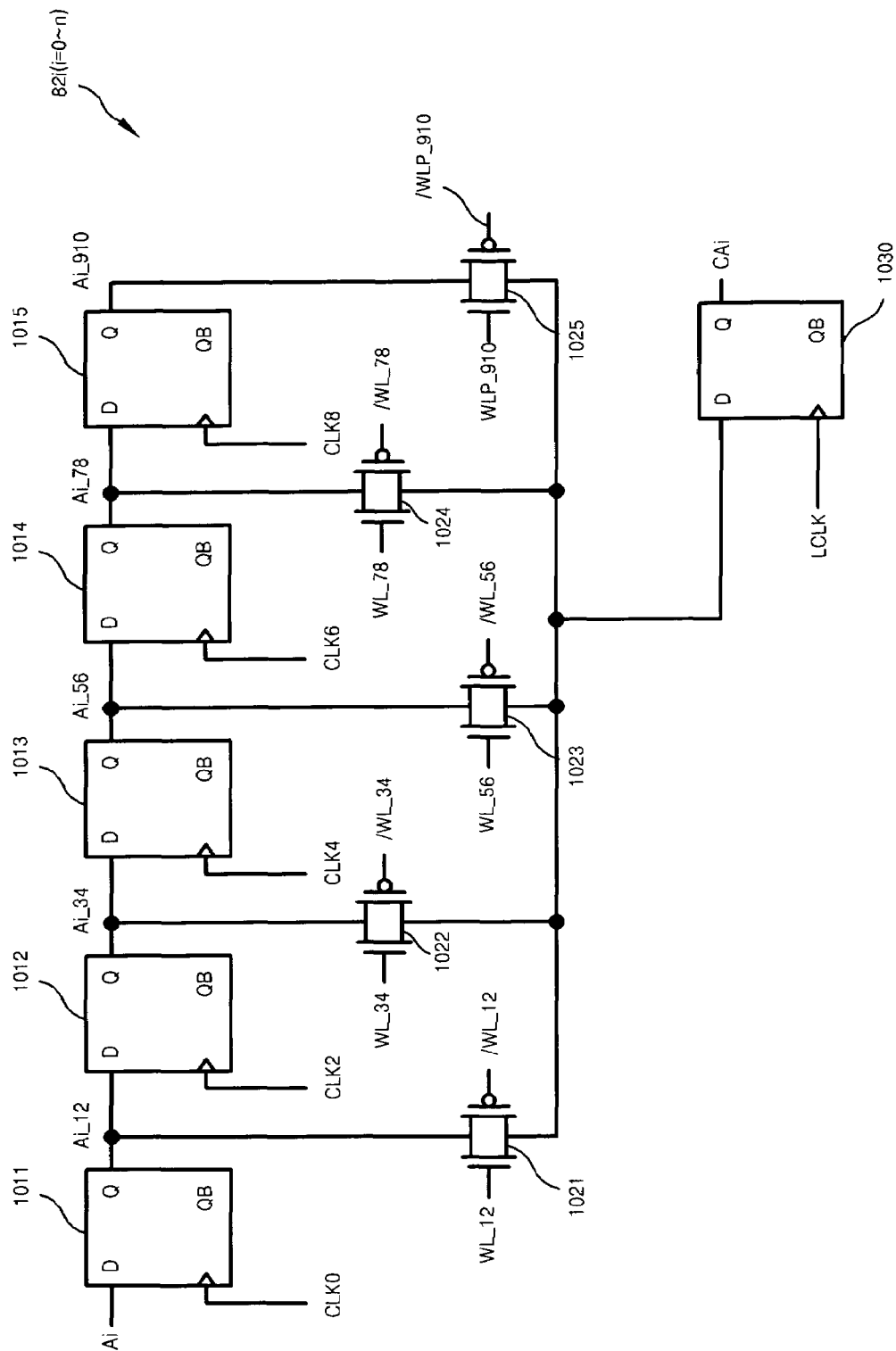
FIG. 10 is a circuit diagram of a slave unit according to another example embodiment of the present invention.

FIG. 10 is a circuit diagram of a slave unit 82*i* (e.g., wherein I=0~n) of FIG. 8 according to another example embodiment of the present invention. In the example embodiment of FIG. 10, the slave unit 82*i* may operate in response to the output signals CLK0, CLK2, CLK4, CLK6 and CLK8 of the master unit 810 illustrated in FIG. 9.

In the example embodiment of FIG. 10, the slave unit 82*i* may include a plurality of registers 1011 through 1015 connected in series, a plurality of switches 1021 through 1025 and an output latch 1030. In an example, each of the registers 1011 through 1015 may be implemented by a flip-flop and each of the switches 1021 through 1025 may be implemented as a transmission gate.

In the example embodiment of FIG. 10, the slave unit 82*i* may generate a delayed address bit signal CAi (e.g., wherein I=0~n) corresponding to a random bit Ai of an address signal in response to the master signals CLK0, CLK2, CLK4, CLK6 and CLK8 output from the master unit 810. Thus, the first through fifth flip-flops 1011 through 1015 may receive the first through fifth master signals CLK0, CLK2, CLK4, CLK6 and CLK8, respectively, through their respective clock terminals CK. The first flip-flop 1011 may receive the address signal Ai and may output the received address signal Ai in response to the first master signal CLK0. The second through fifth flip-flops 1012 through 1015 may receive output signals of previous flip-flops 1011 through 1014, respectively, and may output the respectively received signals in response to the second through fifth master signals CLK2, CLK4, CLK6, and CLK8, respectively.

In the example embodiment of FIG. 10, because the first through fifth master signals CLK0, CLK2, CLK4, CLK6 and CLK8 may have an interval of 2 tCK, the first through fifth flip-flops 1011 through 1015 may generate address signals Ai_12, Ai_34, Ai_56, Ai_78 and Ai_910 by delaying the address signal Ai by 0, 2, 4, 6 and 8 tCK, respectively.

In the example embodiment of FIG. 10, the output signals Ai_12, Ai_34, Ai_56, Ai_78, and Ai_910 of the first through fifth flip-flops 1011 through 1015 may be selectively transmitted to the output latch 1030 through the first through fifth switches 1021 through 1025, which may be closed or opened in response to WL code signals WL_12, WL_34, WL_56, WL_78 and WL_910.

In the example embodiment of FIG. 10, the WL code signals WL_12, WL_34, WL_56, WL_78 and WL_910 may be activated (e.g., set to the first logic level) based on a WL signal. For example, if the WL is 1 or 2, the WL code signal WL_12 may be activated. Alternatively, if the WL is 3 or 4, the WL code signal WL_34 may be activated. In another alternative example, if WL is 5 or 6, the WL code signal WL_56 may be activated. In an example, assume WL is 9, and therefore, the WL code signal WL_910 may be activated. Accordingly, the output signal Ai_910 of the fifth flip-flop 1015 may be transmitted to the output latch 1030. A temporary latch (not shown) may be provided before the output latch 1030 to temporarily latch signals output from the first through fifth switches 1021 through 1025. The output latch 1030 may outputs a received input signal as a delayed address signal CAi in response to a latch clock signal LCLK. The latch clock signal LCLK may be obtained by combining a signal resulting from delaying the write command WR by WL or (WL+AL) clock signals with the internal clock signal PCLK. Accordingly, the latch clock signal LCLK may be generated after WL or (WL+AL) clock signals following the input of the write command WR.

In the example embodiment of FIG. 10, the slave unit 82*i* may receive the column address signal Ai and may outputs the received column address signal Ai in response to the master signals CLK0, CLK2, CLK4, CLK6 and CLK8 sequentially generated by the master unit 810. Thus, the slave unit 82*i* may delay the received column address signal Ai by WL clock cycles and may then output the delayed column address signal Ai. It will be readily apparent that the slave unit 82*i* illustrated in FIG. 10 may alternatively be used to process a bank address signal. Further, a number of flip-flops and/or switches included in the slave unit 82*i* may vary in other example embodiments of the present invention, for example, based on a maximum value of the WL and/or a value of the tCCD.

In the example embodiment of FIG. 10, the master unit 810 and the slave unit 82*i* illustrated in FIGS. 9 and 10 may correspond to example conditions where the tCCD may equal 2. In an alternative example, if the tCCD is 4, master signals output from the master unit 810 may be output at an interval of 4 tCK. Accordingly, only the first, third, and fifth master signals CLK0, CLK4, and CLK8 need be output from the master unit 810 illustrated in FIG. 9 and the second and fourth master signals CLK2 and CLK6 need not be output. Thus, the second and fourth flip-flops 1012 and 1014 receiving the second and fourth master signals CLK2 and CLK6 in the slave unit 82*i* need not be included, and therefore, the number of flip-flops included in a slave unit may be reduced.

Figure 11:
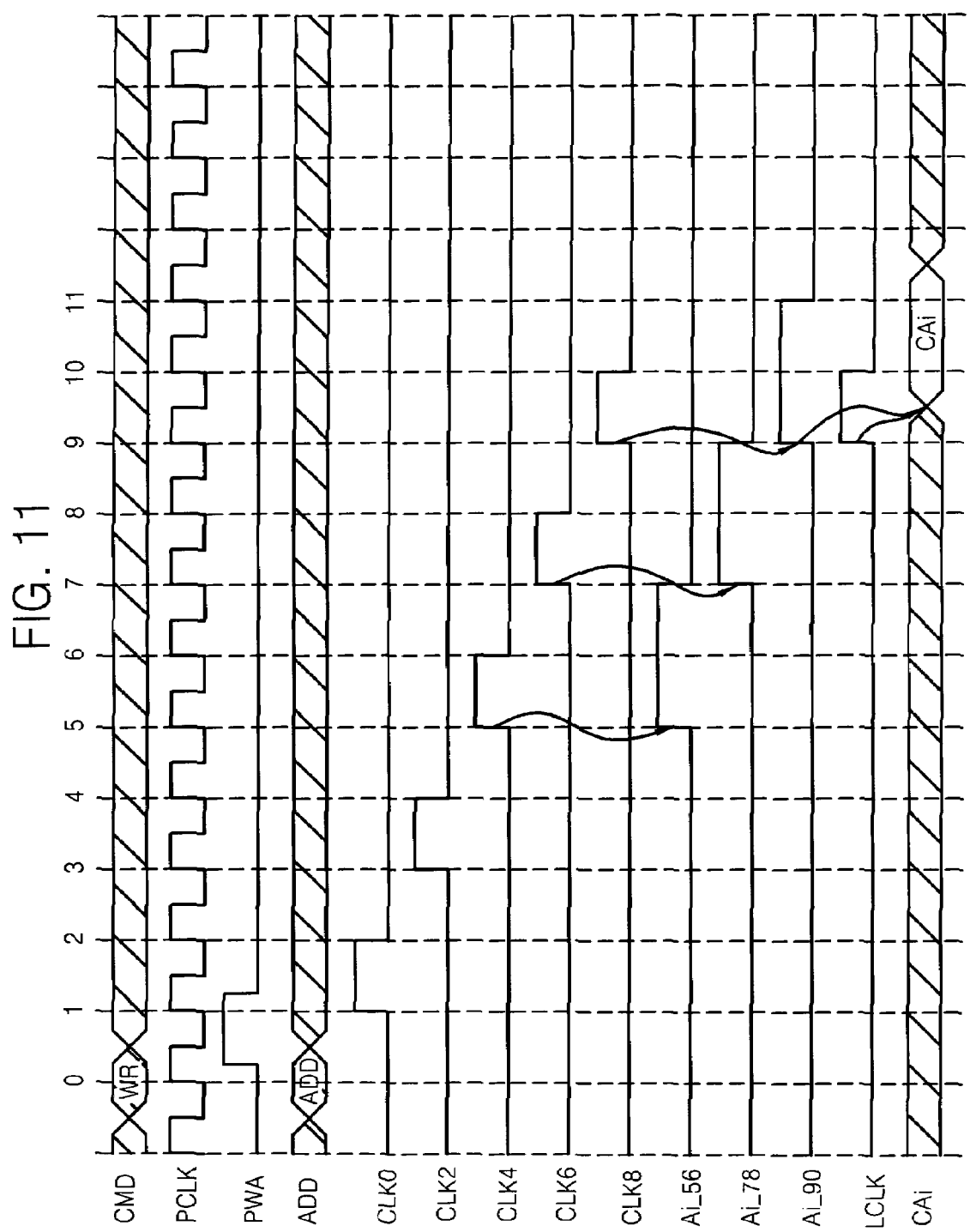
FIG. 11 is a signal timing chart illustrating an operation of the latency control circuit of FIG. 8 when the WL is 9 according to another example embodiment of the present invention.

FIG. 11 is a signal timing chart illustrating an operation of the latency control circuit 200' of FIG. 8 when the WL is 9 according to another example embodiment of the present invention. Example operation of the latency control circuit 200' will be described below in greater detail with reference to FIGS. 9, 10, and 11 below.

In example operation of the latency control circuit 200' of FIG. 8 and when WL equals 9, with reference to FIGS. 9, 10 and 11, the write command WR may be input from an external entity at time 0, and the write command signal PWA may thereafter generated (e.g., during time 1). In addition, the address signal ADD may be input along with the write command WR.

In example operation of the latency control circuit 200' of FIG. 8 and when WL equals 9, with reference to FIGS. 9, 10 and 11, the write command signal PWA may be combined (e.g., via an AND operation) with the internal clock signal PCLK, thereby generating the first master signal CLK0. In addition, 2, 4, 6, and 8 tCK delayed write command signals may be combined (e.g., via AND operations) with the internal clock signal PCLK, thereby generating the second, third, fourth, and fifth master signals CLK2, CLK4, CLK6, and CLK8.

In example operation of the latency control circuit 200' of FIG. 8 and when WL equals 9, with reference to FIGS. 9, 10 and 11, the slave unit 82*i* may sequentially output the received address signal Ai in response to the master signals CLK0, CLK2, CLK4, CLK6 and CLK8 generated by the master unit 810, thereby generating 0, 2, 4, 6, and 8 tCK delayed address signals Ai_12, Ai_34, Ai_56, Ai_78 and Ai_910, respectively. Accordingly, as shown in FIG. 11, the address signals Ai_56, Ai_78, and Ai_910 may be representative of the received address signal Ai delayed by 4, 6, and 8 tCK, respectively.

In example operation of the latency control circuit 200' of FIG. 8 and when WL equals 9, with reference to FIGS. 9, 10 and 11, a given address signal (e.g., Ai_910) among the delayed address signals Ai_12, Ai_34, Ai_56, Ai_78 and Ai_910 may be latched in response to the latch clock signal LCLK, thereby generating the delayed address signal CAi. Delayed address signals CAi may be generated at an interval of tCCD (e.g., 2 tCK), however, for simplicity of explanation, the delayed address signal CAi corresponding to a single write command WR input at the time 0 is illustrated in FIG. 11.

The latency control circuits 200 and 200' according to the example embodiments of FIGS. 2 and 8, respectively, may be configured to delay an address signal (e.g., control a generation time of the address signal) based on latency information, such as WL information. However, it is understood that latency control circuits according to other example embodiments of the present invention are not restricted thereto and may alternatively be used to delay a command signal (e.g., the generation time of the command signal) based on latency information.

Figure 12:
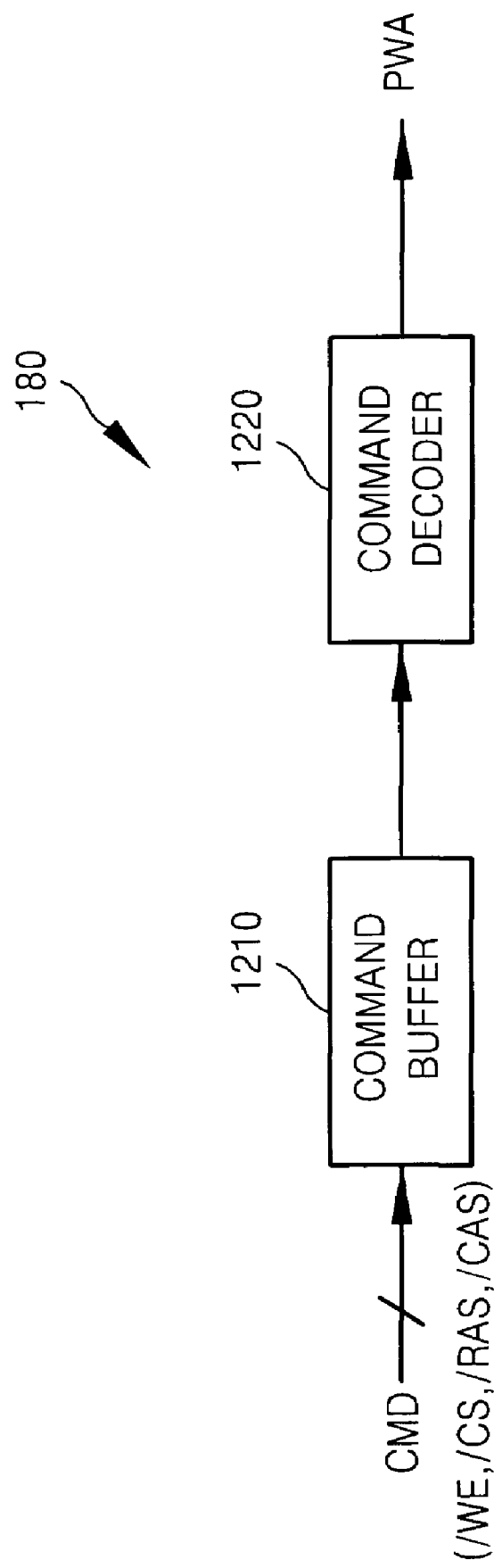
FIG. 12 is a block diagram of a command detection circuit according to another example embodiment of the present invention.

FIG. 12 is a block diagram of the command detection circuit 180 of FIG. 1 according to another example embodiment of the present invention. In the example embodiment of FIG. 12, the command detection circuit 180 may include a command buffer 1210 and a command decoder 1220. If the semiconductor memory device 100 includes the command detection circuit 180 as illustrated in FIG. 12, a latency control process need not be used with respect to a command signal.

Figure 13:
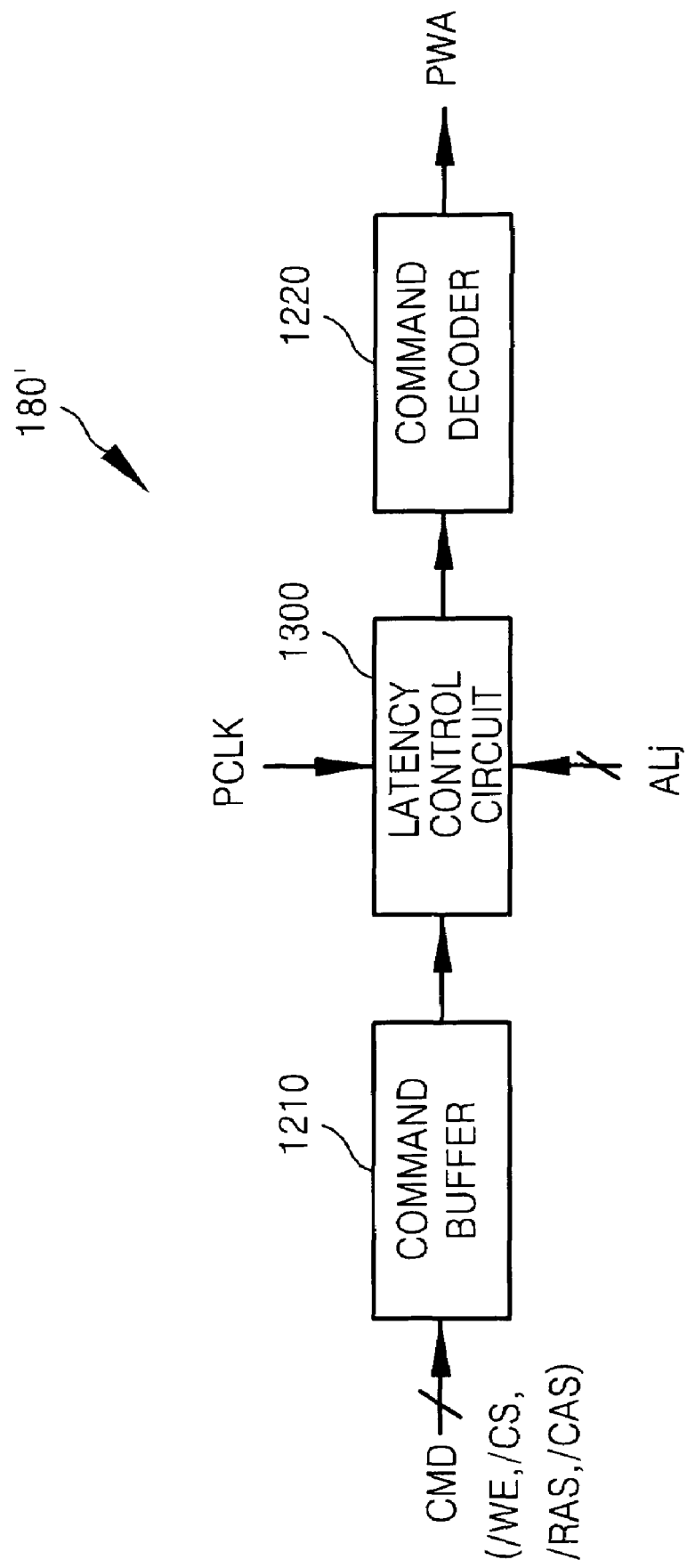
FIG. 13 is a block diagram of a command detection circuit according to another example embodiment of the present invention.

FIG. 13 is a block diagram of a command detection circuit 180' according to another example embodiment of the present invention. In the example embodiment of FIG. 13, the command detection circuit 180' may include the command buffer 1210, a latency control circuit 1300 and the command decoder 1220. If the semiconductor memory device 100 includes the command detection circuit 180' illustrated in FIG. 13, the latency control process (e.g., above described with respect to FIGS. 1 through 11) may be used with respect to a command signal.

In the example embodiment of FIG. 13, the latency control circuit 1300 may control the internal generation time of the command signal CMD (e.g., /WE, /CS, /CAS, etc.) based on the AL signal ALj (e.g., wherein "j" may be a positive integer). Thus, the latency control circuit 1300 may delay the command signal CMD based on the AL signal ALj.

Figure 14:
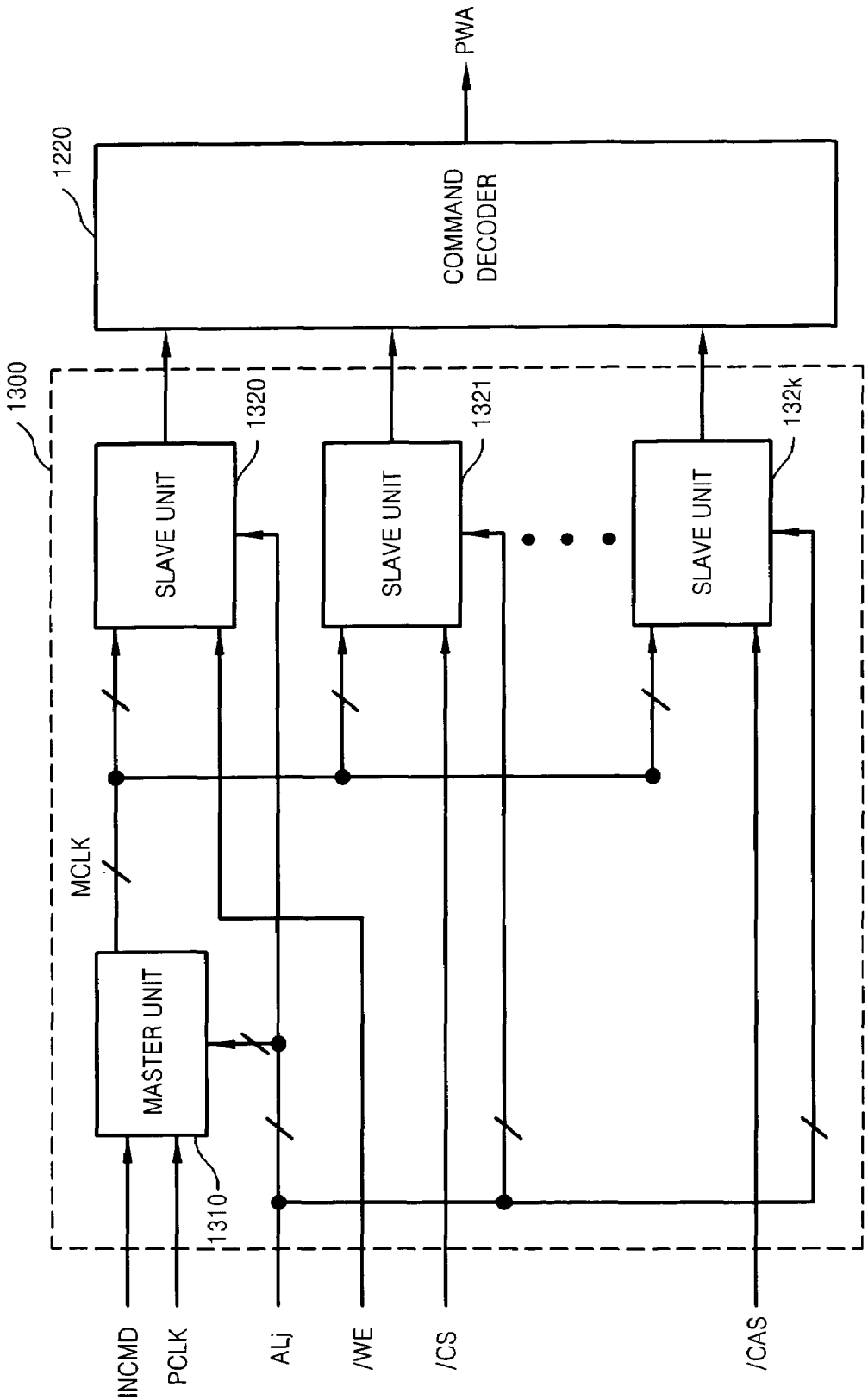
FIG. 14 is a block diagram of another latency control circuit according to another example embodiment of the present invention.

FIG. 14 is a block diagram of the latency control circuit 1300 according to another example embodiment of the present invention. In the example embodiment of FIG. 14, the latency control circuit 1300, similar the latency control circuits 200 and 200' illustrated in FIGS. 2 and 8, respectively, may include a master unit 1310 and a plurality of slave units 132*i* (e.g., wherein I=0~k).

In the example embodiment of FIG. 14, the master unit 1310 may generate one or more master signals MCLK in response to the internal clock signal PCLK, a command reference signal INCMD and the AL signal ALj. The command reference signal INCMD may be referred to when the master signals MCLK having an interval of an integer multiple of the internal clock signal PCLK (e.g., an integer multiple of a clock cycle) is generated. For example, the command reference signal INCMD may be a /CS signal activated (e.g., set to the first logic level) if a command signal is applied from an external entity to the semiconductor memory device 100 or may alternatively be a signal based on the /CS signal.

In the example embodiment of FIG. 14, the slave units 132*i* may latch and output corresponding command signals (e.g., /WE, /CS, and /CAS, respectively) in response to the master signals MCLK generated by the master unit 210. As a result, the slave units 132*i* may delay their respective received command signals /WE, /CS, and /CAS by AL clock cycles.

In the example embodiment of FIG. 14, the master unit 1310 may have a similar structure as the master unit 210, 610 and/or 810, and the slave unit 132*i* (e.g., wherein I=0~k) may have a similar structure as the slave unit 22*i*, 710 or 82*i*, except with respect to input and output signals included therein. Thus, detailed descriptions of the structures and operations of the master unit 1310 and the slave unit 132*i* have been omitted for the sake of brevity.

In the example embodiment of FIG. 14, the latency control circuit 1300 may be disposed before the command decoder 1220. However, in another example embodiment of the present invention, while not shown, the latency control circuit 1300 may be disposed after the command decoder 1220. Thus, a decoded command signal may be controlled according to the AL.

In the example embodiment of FIG. 14, the write command signal PWA may be generated based on AL information. For example, the write command signal PWA may be generated or activated (e.g., set to the first logic level) after a number of clock cycles corresponding to the AL following an input of the write command signal PWA from an external entity. Accordingly, the column or bank address signal CA or BAL may be controlled based on the write command signal PWA, delayed corresponding to the AL, and may be generated based on the AL and WL information. Alternatively, the write command signal PWA may be "immediately" (e.g., without delays) generated irrespective of the latency information and the column or bank address signal CA or BAL may be generated based on the AL and WL information.

In the example embodiment of FIG. 14, a plurality of master signals, which may be generated from a master unit of a latency circuit, may be set to have an interval of about tCCD. However, it is understood that other example embodiments of the present invention may be directed to master signals having different intervals.

Figure 15:
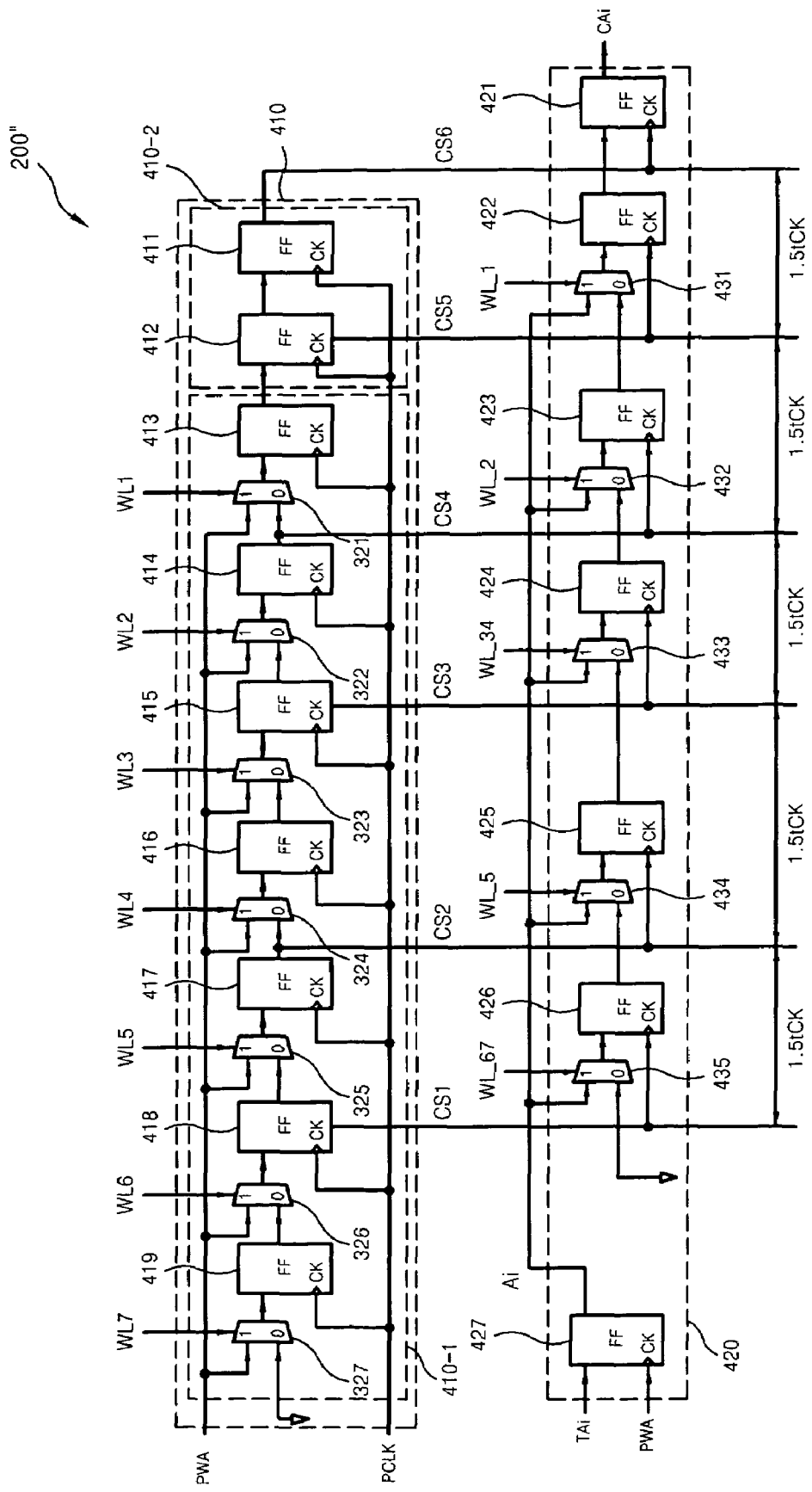
FIG. 15 is a block diagram of another latency control circuit according to another example embodiment of the present invention.

FIG. 15 is a block diagram of a latency control circuit 200" according to another example embodiment of the present invention.

In the example embodiment of FIG. 15, similar to the latency control circuits 200 and 200' described above, the latency control circuit 200" illustrated in FIG. 15 may further include a master unit 410 and a slave unit 420. While only one slave unit 420 is illustrated in FIG. 15, it is understood that any number of slave units (e.g., corresponding to the number of bits in an address signal) may be included within the latency control circuit 200" in other example embodiments of the present invention. For example, the latency control circuit 200" may include a plurality of slave units, each of which may receive a plurality of master signals CSi output from the master unit 410. As will be described hereinafter, for example purposes, it may be assumed that the latency control circuit 200" is embodied so as to satisfy the conditions of tCCD=2, BL=4 and a maximum value of WL is 7.

In the example embodiment of FIG. 15, the master unit 410 may include a plurality of registers 411 through 419 and a plurality of the multiplexers 321 through 327, which may be connected in cascade or series. In an example, each of the registers 411 through 419 may be implemented by a flip-flop. The number of flip-flops included in the master unit 410 may be determined by the maximum value of the WL and the BL. For example, if the maximum value of the WL is M (e.g., where M may be a natural number, or a positive integer greater than or equal to 1) and the burst length is BL, the master unit 410 may include at least (M+BL/2) flip-flops.

In the example embodiment of FIG. 15, a structure of the master unit 410 may be similar to that of the master unit 210 illustrated in FIG. 3. In the master unit 410, blocks 410-1 and 410-2 may correspond to the write master signal generator 310 and the burst master signal generator 330, respectively, included in the master unit 210 illustrated in FIG. 3. However, the master unit 410 may differ from the master unit 210 in that an interval among the plurality of master signals CSi (e.g., CS1 through CS6) output from the master unit 410 may not be an integer multiple of tCCD. For example, an interval between adjacent master signals among the plurality of master signals CSi output from the master unit 410 may be selected within a range that does not exceed the tCCD.

In the example embodiment of FIG. 15, in an example, an interval between master signals may not be greater than (BL/2−0.5) tCK, or tCCD−0.5 tCK. 0.5 tCK may be a margin considered if a signal (e.g., PWA or Ai) is transmitted through a flip-flop. However, such a margin may be adjusted as necessary. Accordingly, an interval between adjacent master signals may not be greater than (BL/2−α) tCK, where α may refer a real number which is at least equal to 0 and less than tCCD. In order to adjust an interval between master signals to (BL/2−α) tCK instead of tCCD, output signals from an internal node of a flip-flop may be included in a master unit. The structure of such a flip-flop will be described in greater detail later.

In the example embodiment of FIG. 15, an interval between the master signals CSi may be (BL/2−0.5) tCK (e.g., 1.5 tCK). However, the interval between the master signals CSi need not be limited to a relatively constant 1.5 tCK. Rather, the interval may be set to any well known value, such as 1.5 tCK and 1.0 tCK. In addition, in order to adjust the entire delay time, at least one value of the interval between the master signals CSi may be 1.0 tCK or less (e.g., 0.5 tCK).

In the example embodiment of FIG. 15, the slave unit 420 may include a plurality of flip-flops 421 through 426 (e.g., 6) and multiplexers 431 through 435. The flip-flops 421 through 426 in the slave unit 420 may be connected in series and may each receive an input signal in response to a corresponding signal among the plurality of the master signals CSi output from the master unit 410. The slave unit 420 may further include a flip-flop 427 which may latch and output an address signal TAi in response to the write command signal PWA. The address signal TAi may be the signal ADD output from the address buffer 120 illustrated in FIG. 1. The flip-flop 427 may latch a previous address signal before the address buffer 120 may output a subsequent address signal.

In the example embodiment of FIG. 15, each of the multiplexers 431 through 435 may select and output one of an output signal of a previous or preceding flip-flop and the address signal Ai in response to a corresponding signal among WL code signals WL_1, WL_2, WL_34, WL_5 and WL_67. The WL code signals WL_1, WL_2, WL_34, WL_5, and WL_67 may be activated (e.g., set to the first logic level) based on the WL information. For example, the WL code signal WL_1 may be activated (e.g., set to the first logic level) if WL=1, the WL code signal WL_2 may be activated if WL=2, the WL code signal WL_34 may be activated if WL=3 or 4, the WL code signal WL_5 may be activated if WL=5, and the WL code signal WL_67 may be activated if WL=6 or 7. Accordingly, if WL=1, the address signal Ai may be sequentially delayed by the flip-flops 422 and 421 and a delayed address signal CAi may be generated. If WL=6 or 7, the address signal Ai may be sequentially delayed by the flip-flops 426, 425, 424, 423, 422 and 421 and a delayed address signal CAi may be generated.

In the example embodiment of FIG. 15, the slave unit 420 may receive the address signal Ai and may sequentially latch the address signal Ai in response to activated signals (e.g., set to the first logic level) among the plurality of the master signals CSi generated by the master unit 410. Thus, the address signal Ai may be delayed by (WL+BL/2) clock cycles.

FIG. 16A is a signal timing chart illustrating an operation of the latency control circuit 200" of FIG. 15 when the WL is 7 and the BL is 4, according to another example embodiment of the present invention. Example operation of the latency control circuit 200" when the WL is 7 and BL is 4 will now be described in greater detail with reference to FIGS. 15 and 16A.

In example operation of the latency control circuit 200" of FIG. 15 when the WL is 7 and the BL is 4, with reference to FIGS. 15 and 16A, the latency signal WL7 may be activated (e.g., set to the first logic level) and the remaining latency signals WLi (e.g., wherein I=1 through 6) may be deactivated (e.g., set to the second logic level). Accordingly, the multiplexer 327 may select and output the write command signal PWA and remaining multiplexers 326 through 321 may select and output corresponding previous or preceding flip-flops 419 through 414. The write command signal PWA may be input to the flip-flop 419 and may be output in synchronization with a rising edge of the internal clock signal PCLK. An output signal of the flip-flop 419 may be input to the subsequent flip-flop 418 and may be output as a first master signal CS1 in synchronization with a falling edge of the internal clock signal PCLK, and may also be output in synchronization with a rising edge of the internal clock signal PCLK. An output signal of the flip-flop 418 may be input to the subsequent flip-flop 417 and may be output in synchronization with a rising edge of the internal clock signal PCLK. In this way, the write command signal PWA may be passed through the nine flip-flops 419 through 411 and first through sixth master signals CS1 through CS6 may be generated at a given interval (e.g., about 1.5 tCK). Thus, the first through sixth master signals CS1 through CS6 may be sequentially activated about with delays of 1.5, 3, 4.5, 6, 7.5, and 8 tCK, respectively, following the time 0 (e.g., when the write command WR and the address signal ADD are received).

In example operation of the latency control circuit 200" of FIG. 15 when the WL is 7 and the BL is 4, with reference to FIGS. 15 and 16A, the slave unit 420 may output the address signal Ai in response to the first master signal CS1 and may output a given signal (e.g., the receipt of which may be triggered by the first master signal CS1) in response to the second master signal CS2. Thus, the slave unit 420 may sequentially delay the address signal Ai in response to the first through sixth master signals CS1 through CS6 and the delayed address signal CAi. Thus, the delayed address signal CAi may be generated (WL+BL/2) tCK (e.g., 9 tCK) following the time 0 when the write command WR and the address signal ADD are input.

FIG. 16B is a signal timing chart illustrating an operation of the latency control circuit 200" of FIG. 15 when the WL is 1 and the BL is 4 according to another example embodiment of the present invention. Example operation of the latency control circuit 200" when the WL is 1 and BL is 4 will now be described in greater detail with reference to FIGS. 15 and 16B.

In example operation of the latency control circuit 200" of FIG. 15 when the WL is 1 and the BL is 4, with reference to FIGS. 15 and 16B, the latency signal WL1 may be activated (e.g., set to the first logic level) and the remaining latency signals WLi (e.g., wherein i=2 through 7) may be deactivated (e.g., set to the second logic level). Accordingly, the write command signal PWA may be input to the flip-flop 413 and may be output in synchronization with a rising edge of the internal clock signal PCLK. An output signal of the flip-flop 413 may be input to the subsequent flip-flop 412 and may be output as the fifth master signal CS5 in synchronization with a falling edge of the internal clock signal PCLK, and may further be output in synchronization with a rising edge of the internal clock signal PCLK. An output signal of the flip-flop 412 may be input to the subsequent flip-flop 411 and may be output in synchronization with a rising edge of the internal clock signal PCLK. An output signal of the flip-flop 411 may be the sixth master signal CS6. Accordingly, the write command signal PWA may be passed through the three flip-flops 413 through 411 and the fifth and sixth master signals CS5 and CS6 may be generated at a given interval (e.g., about 1.5 tCK). Thus, the fifth and sixth master signals CS5 and CS6 may be sequentially activated about 1.5 and 3 tCK, respectively, after the time 0 when the write command WR and the address signal ADD are input. The remaining master signals CS1 through CS4 may thereby not be activated.

In example operation of the latency control circuit 200" of FIG. 15 when the WL is 7 and the BL is 4, with reference to FIGS. 15 and 16B, the slave unit 420 may output the address signal Ai in response to the fifth master signal CS5 and may output a given signal (e.g., the receipt of which may be triggered by the fifth master signal CS5) in response to the sixth master signal CS6, thereby generating the delayed address signal CAi. Thus, the delayed address signal CAi may be generated (WL+BL/2) tCK (e.g., 3 tCK) after the time 0 when the write command WR and the address signal ADD are input.

Figure 17A:
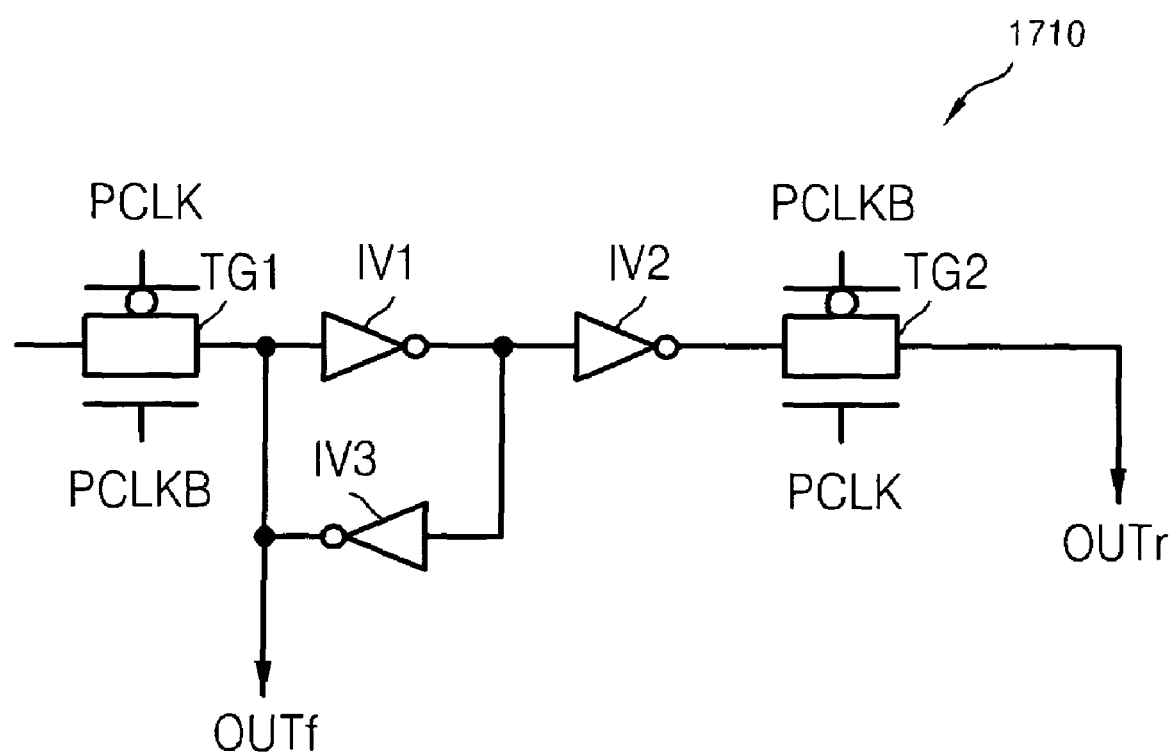
FIGS. 17A and 17B are circuit diagrams of respective flip-flops according to another example embodiment of the present invention.
Figure 17B:
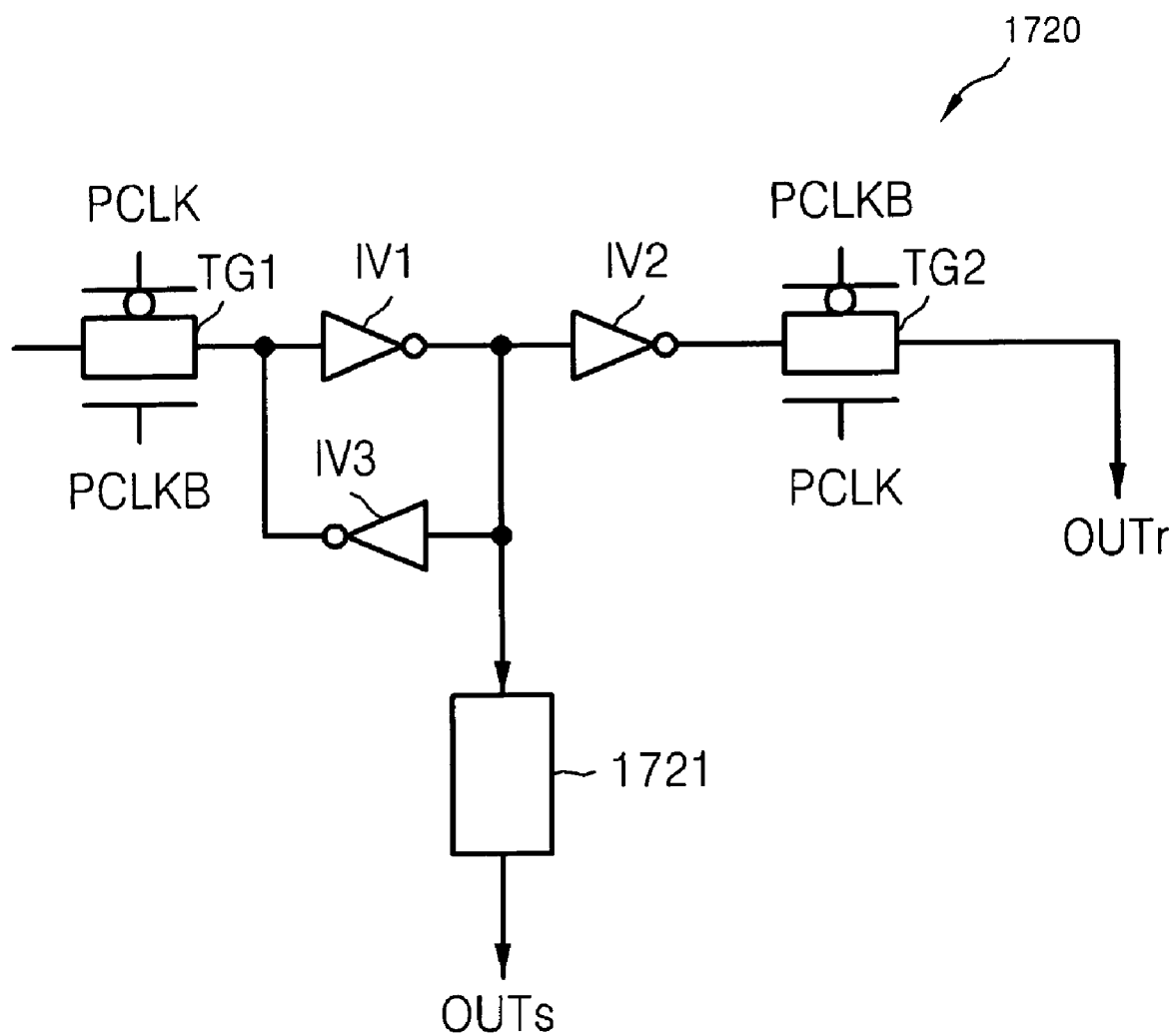

FIGS. 17A and 17B are circuit diagrams of flip-flops 1710 and 1720, respectively, according to another example embodiment of the present invention. In an example, the flip-flops may be included within one or more of the latency control circuits 200, 200", etc.

In the example embodiment of FIG. 17A, the flip-flop 1710 may include switch elements TG1 and TG2 and inverters IV1, IV2 and IV3. In an example, the switch elements TG1 and TG2 may each be implemented by a transmission gate.

In the example embodiment of FIG. 17A, the first switch element TG1 may receive an input signal in response to a clock signal PCLK set to the second logic level (e.g., a lower logic level or logic "0") and may be turned off in response to the clock signal PCLK set to the first logic level (e.g., a higher logic level or logic "1"). The inverters IV1, IV2 and IV3 may function as latches. The input signal received through the first switch element TG1 may be latched and may be output as a first output signal OUTf. The second switch element TG2 may output the latched signal as a second output signal OUTr in response to the first logic level of the clock signal PCLK. Accordingly, the first output signal OUTf may be output at a first edge (e.g., a falling edge) of the clock signal PCLK and the second output signal OUTr may be output at a second edge (e.g., a rising edge) of the clock signal PCLK. Thus, an interval between the first output signal OUTf and the second output signal OUTr may be ½ of the clock cycle of the clock signal PCLK.

In the example embodiment of FIG. 17B, the flip-flop 1720 may include a delay element 1721, in addition to structure above described with respect to the flip-flop 1710 illustrated in FIG. 17A. The delay element 1721 may delay a signal of an internal node (e.g., an output signal of the inverter IV2) by a given delay time. Accordingly, an output signal OUTs of the delay element 1721 and the second output signal OUTr may have a given interval therebetween. The interval between the output signal OUTs of the delay element 1721 and the second output signal OUTr may be adjusted by adjusting the delay time of the delay element 1721. Thus, an interval between master signals may be adjusted.

Figure 18:
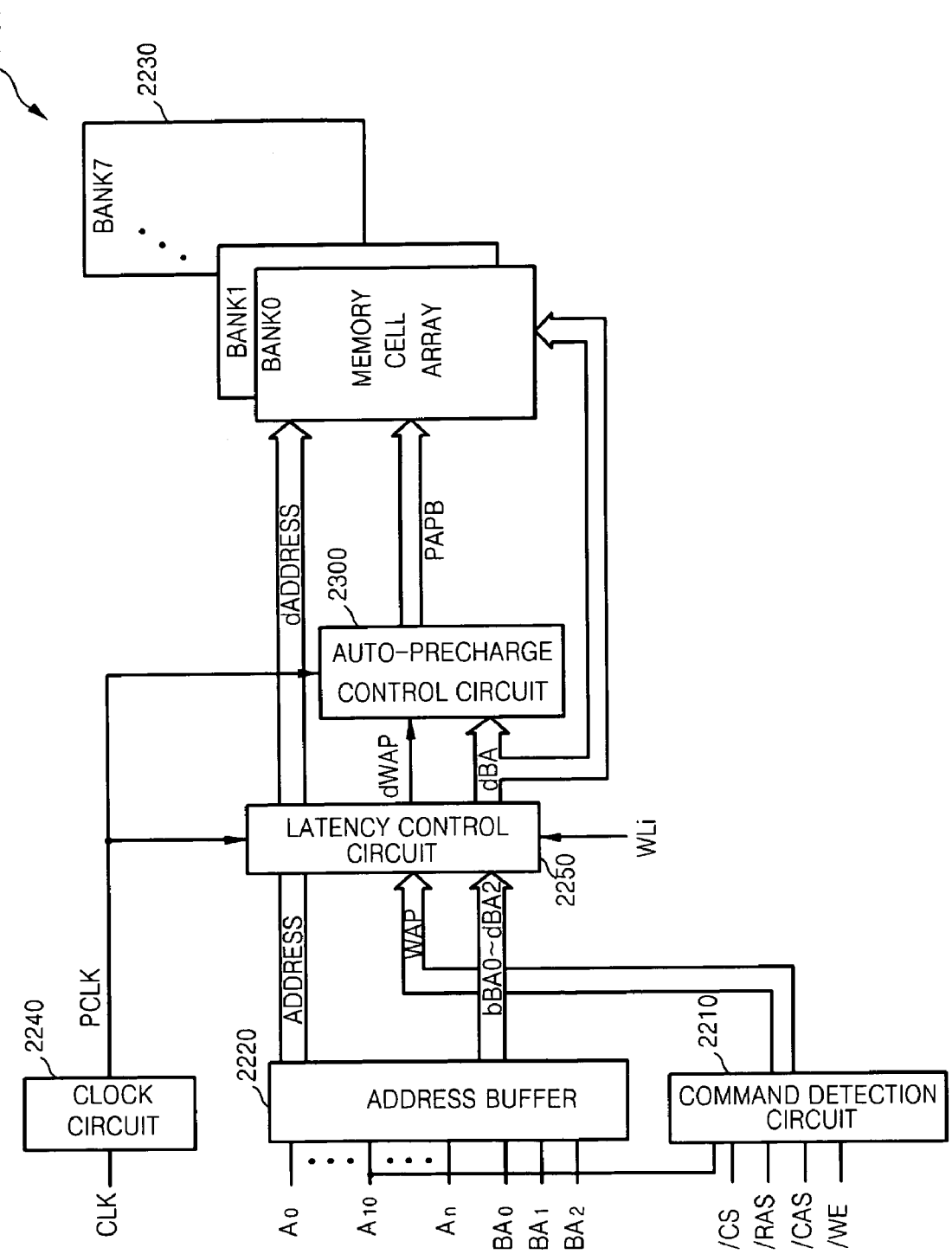
FIG. 18 is a block diagram of a semiconductor memory device according to another example embodiment of the present invention.

FIG. 18 is a block diagram of a semiconductor memory device 2200 according to another example embodiment of the present invention. In the example embodiment of FIG. 18, the semiconductor memory device 2200 may include a command detection circuit 2210, an address buffer 2220, a plurality of banks 2230, a clock circuit 2240, a latency control circuit 2250 and an auto-precharge control circuit 2300. In an example, the semiconductor memory device 2200 may be representative of a DDR3 DRAM device having an operating frequency of 1.6 Gigahertz, 8 banks, and a column command delay (CCD) of 4.

In the example embodiment of FIG. 18, the command detection circuit 2210 may receive command signals /CS, /RAS, /CAS, and /WE and a given address bit signal A10 from an external entity, may decode the received command signals, and may output an internal command signal (e.g., based on the decoding). For example, if the given address bit signal A10 is set to the first logic level (e.g., a higher logic level or logic "1") along with a write command, the command detection circuit 2210 may output a write auto-precharge command signal WAP.

In the example embodiment of FIG. 18, the address buffer 2220 may buffer externally input addresses A0 through An and BA0 through BA2 and may output a buffered bank address bBA (e.g., addresses bBA0 through bBA2) and a memory cell address ADDRESS, which may indicate a bank and a memory cell, respectively, at which a write auto-precharge command will be executed.

In the example embodiment of FIG. 18, the plurality of the banks 2230 may each include a memory cell array and may function as data storage, in which data may be input to or output from, based on the buffered bank address bBA and the memory cell address ADDRESS, which may be output from the address buffer 2220. A write auto-precharge operation may be performed with respect to the plurality of the banks 2230 according to the buffered bank address bBA and the write auto-precharge command signal WAP. The clock circuit 2240 may generate an internal clock signal PCLK based on an external clock signal ECLK.

In the example embodiment of FIG. 18, the latency control circuit 2250 may delay the write auto-precharge command signal WAP, the buffered bank address bBA, and the memory cell address ADDRESS by a given delay time in response to the internal clock signal PCLK and a latency control signal WLi and may output a delayed bank address signal dBA (e.g., signals dBA0 through dBA2) and a delayed memory cell address signal dADDRESS. The given delay time may correspond to a given write latency tWL plus a data burst period tBURST. In an example, the write latency tWL may be one clock cycle of the internal clock signal PCLK and the data burst period tBURST may be four clock cycles of the internal clock signal PCLK.

In the example embodiment of FIG. 18, the band address signal dBA and the memory cell address signal dADDRESS may be input to the plurality of the banks 2230 and the band address signal dBA may be input to the auto-precharge control circuit 2300. Accordingly, after five clock cycles corresponding to the write latency tWL plus the data burst period tBURST following receipt of the write auto-precharge command signal WAP at to the latency control circuit 2250, a write operation may be performed at a cell in a particular bank, designated by the band address signal dBA and the memory cell address signal dADDRESS, among the plurality of the banks 2230. In an example, the latency control circuit 2250 may correspond to any one of the latency control circuits 200, 200', 200" and 1300.

In the example embodiment of FIG. 18, the auto-precharge control circuit 2300 may delay a delayed write auto-precharge command signal dWAP and the band address signal dBA, which may be output from the latency control circuit 2250, by a write recovery time tWR and may output a precharge main signal PAPB (e.g., signals PAPB0 through PAPB7) to the plurality of the banks 2230 in order to control a time at which a precharge operation starts after the write operation is finished.

Figure 19:
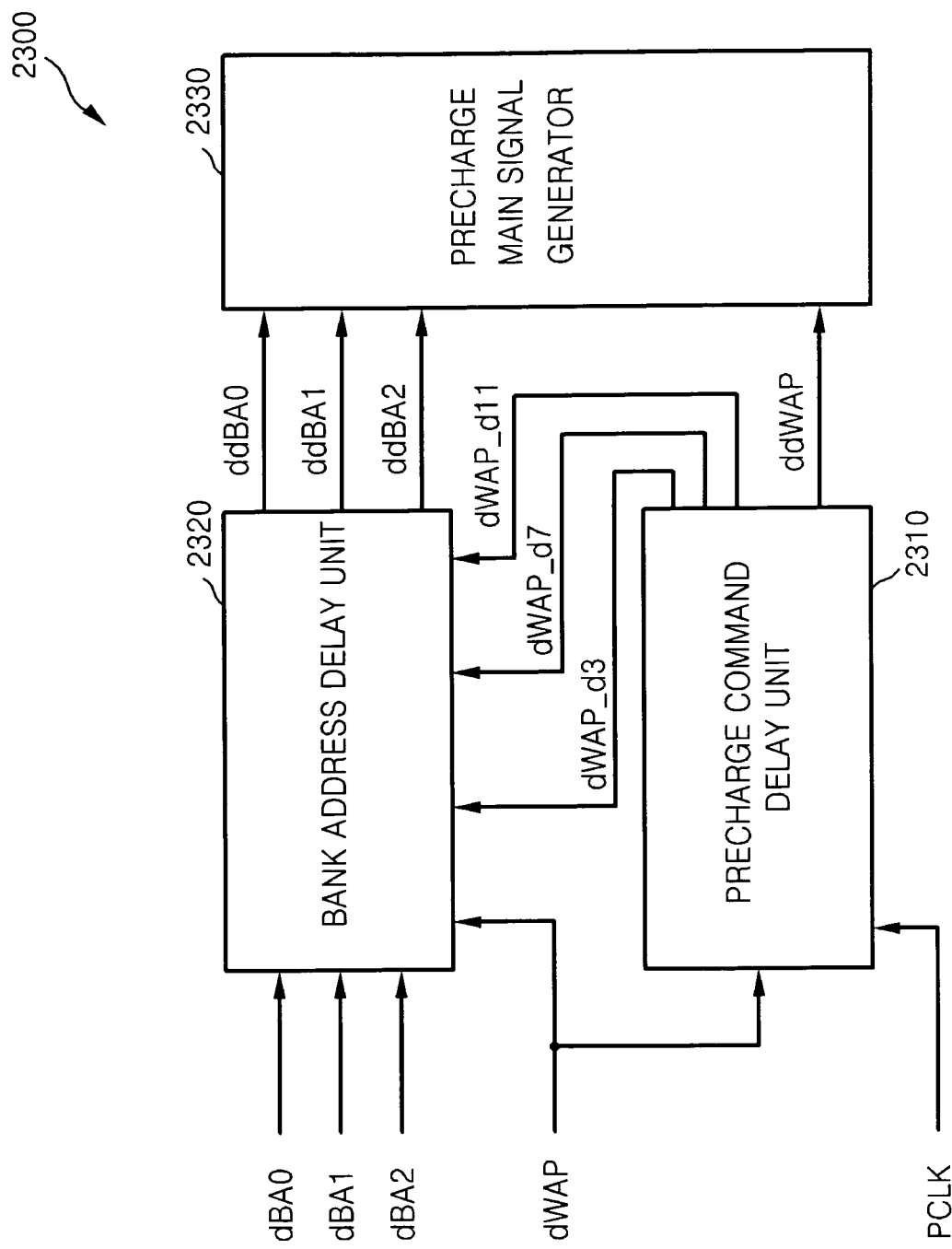
FIG. 19 is a block diagram of an auto-precharge control circuit according to another example embodiment of the present invention.

FIG. 19 is a block diagram of the auto-precharge control circuit 2300 according to another example embodiment of the present invention. In the example embodiment of FIG. 19, the auto-precharge control circuit 2300 may include a precharge command delay unit 2310, a bank address delay unit 2320 and a precharge main signal generator 2330.

In the example embodiment of FIG. 19, the precharge command delay unit 2310 may output a plurality of first precharge command delay signals dWAP_d3, dWAP_d7 and dWAP_d11, which may be enabled after different delay times subsequent to the input of the delayed write auto-precharge command signal dWAP, in response to the internal clock signal PCLK. Also, the precharge command delay unit 2310 may delay the delayed write auto-precharge command signal dWAP by as a given number of clock cycles (e.g., 12 clock cycles) of the internal clock signal PCLK corresponding to the write recovery time tWR, and may output a second precharge command delay signal ddWAP.

In the example embodiment of FIG. 19, an enabling interval among the first precharge command delay signals dWAP_d3, dWAP_d7, and dWAP_d11 (e.g., an interval between a time when one of the first precharge command delay signals dWAP_d3, dWAP_d7, and dWAP_d11 is enabled and a time when a subsequent first precharge command delay signal is enabled) may be less than or equal to a number of clock cycles of the internal clock signal PCLK (CCD=4), which may correspond to a minimum interval between commands, tCCD (e.g., because the bank address signals dBA0, dBA1, and dBA2 may be changed at the minimum interval between commands, tCCD, such as 4 clock cycles).

Figure 20:
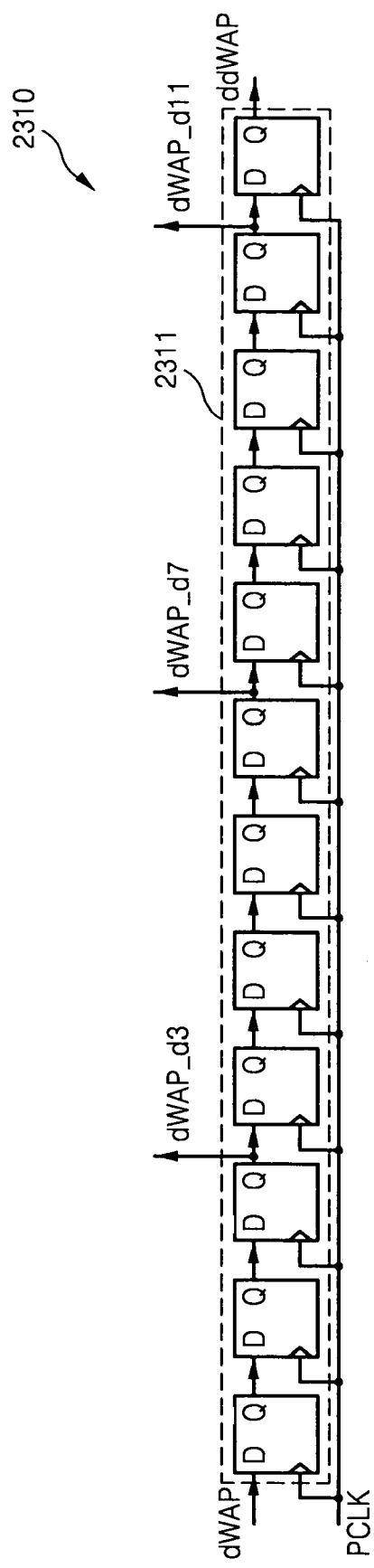
FIG. 20 is a circuit diagram of a precharge command delay unit according to another example embodiment of the present invention.

FIG. 20 is a circuit diagram of the precharge command delay unit 2310 of FIG. 19, according to another example embodiment of the present invention. In the example embodiment of FIG. 20, the precharge command delay unit 2310 may include a first register array 2311 including a plurality of registers (e.g., corresponding to a number of clock cycles of the internal clock signal PCLK of the write recovery time tWR) connected in series. In an example, the write recovery time tWR may be 15 ns and a single clock cycle of the internal clock signal PCLK may be 1.25 ns, and therefore, the first register array 2311 may include 12 (e.g., 15/1.25) registers.

In the example embodiment of FIG. 19, the first precharge command delay signals dWAP_d3, dWAP_d7, and dWAP_d11 may be output from the third, seventh and eleventh registers, respectively, among the 12 registers forming the first register array 2311. The second precharge command delay signal ddWAP may be output from the "last" (e.g., twelfth register) among the 12 registers forming the first register array 2311.

In the example embodiment of FIG. 19, the first precharge command delay signals dWAP_d3, dWAP_d7, and dWAP_d11 and the second precharge command delay signal ddWAP may be respectively enabled at intervals of 3, 4, 4, and 1 clock cycles of the internal clock signal PCLK. Thus, the enabling intervals may be less than or equal to the number of clock cycles (CCD=4) of the internal clock signal PCLK corresponding to the minimum interval between commands, tCCD.

In the example embodiment of FIG. 19, the bank address delay unit 2320 may delay the bank address signals dBA0, dBA1 and dBA2 in response to the delayed write auto-precharge command signal dWAP and the first precharge command delay signals dWAP_d3, dWAP_d7, and dWAP_d11.

Figure 21:
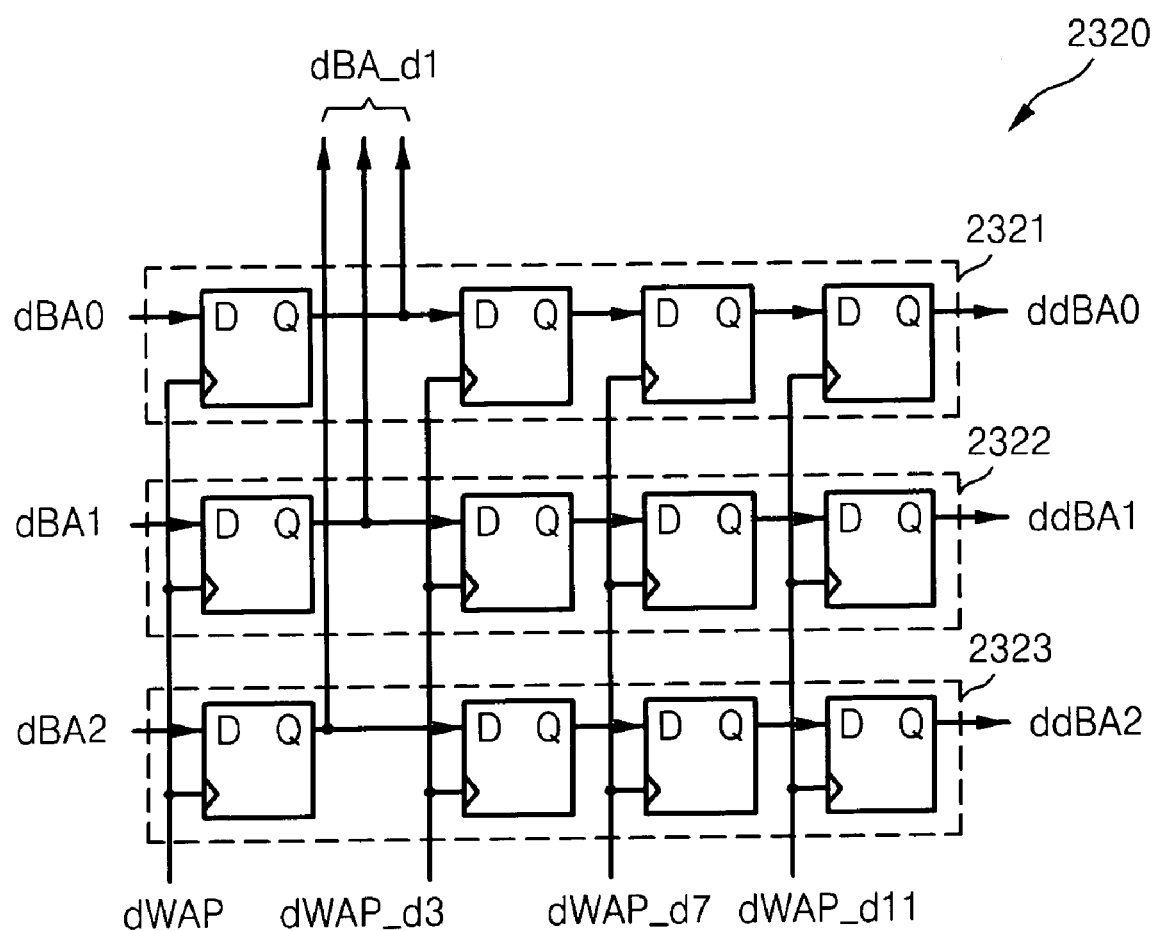
FIG. 21 is a circuit diagram of a bank address delay unit according to another example embodiment of the present invention.

FIG. 21 is a circuit diagram of the bank address delay unit 2320 of FIG. 19 according to another example embodiment of the present invention. In the example embodiment of FIG. 21, the bank address delay unit 2320 may include a plurality of second register arrays 2321, 2322 and 2323 in which registers numbering one more than a number of the first precharge command delay signals dWAP_d3, dWAP_d7, and dWAP_d11 may be connected in series.

In the example embodiment of FIG. 21, the second register arrays 2321, 2322 and 2323, first registers may latch and output bit signals dBA0, dBA1 and dBA2, respectively, in response to the delayed write auto-precharge command signal dWAP and may output a signal dBA_d1. The remaining registers (e.g., other than the first register) in each of the second register arrays 2321, 2322 and 2323 may latch and output signals, which are output from their previous or preceding registers, in response to the first precharge command delay signals dWAP_d3, dWAP_d7 and dWAP_d11, respectively.

In the example embodiment of FIG. 21, a bank delay signal ddBA (e.g., bank delay signals ddBA0 through ddBA2) may be enabled (e.g., set to the first logic level) in response to the first precharge command delay signals dWAP_d3, dWAP_d7 and dWAP_d11, which may be enabled at intervals that may be less than or equal to a number of clock cycles (CCD=4) of the internal clock signal PCLK corresponding to the minimum interval between commands, tCCD, because a minimum interval between commands, tCCD, in DDR3 may correspond to four clock cycles of the internal clock signal PCLK.

In the example embodiment of FIG. 21, the precharge main signal generator 2330 may output the precharge main signal PAPB based on the bank delay signals ddBA0 through ddBA2 (e.g., the signal ddBA) and the second precharge command delay signal ddWAP.

Figure 22:
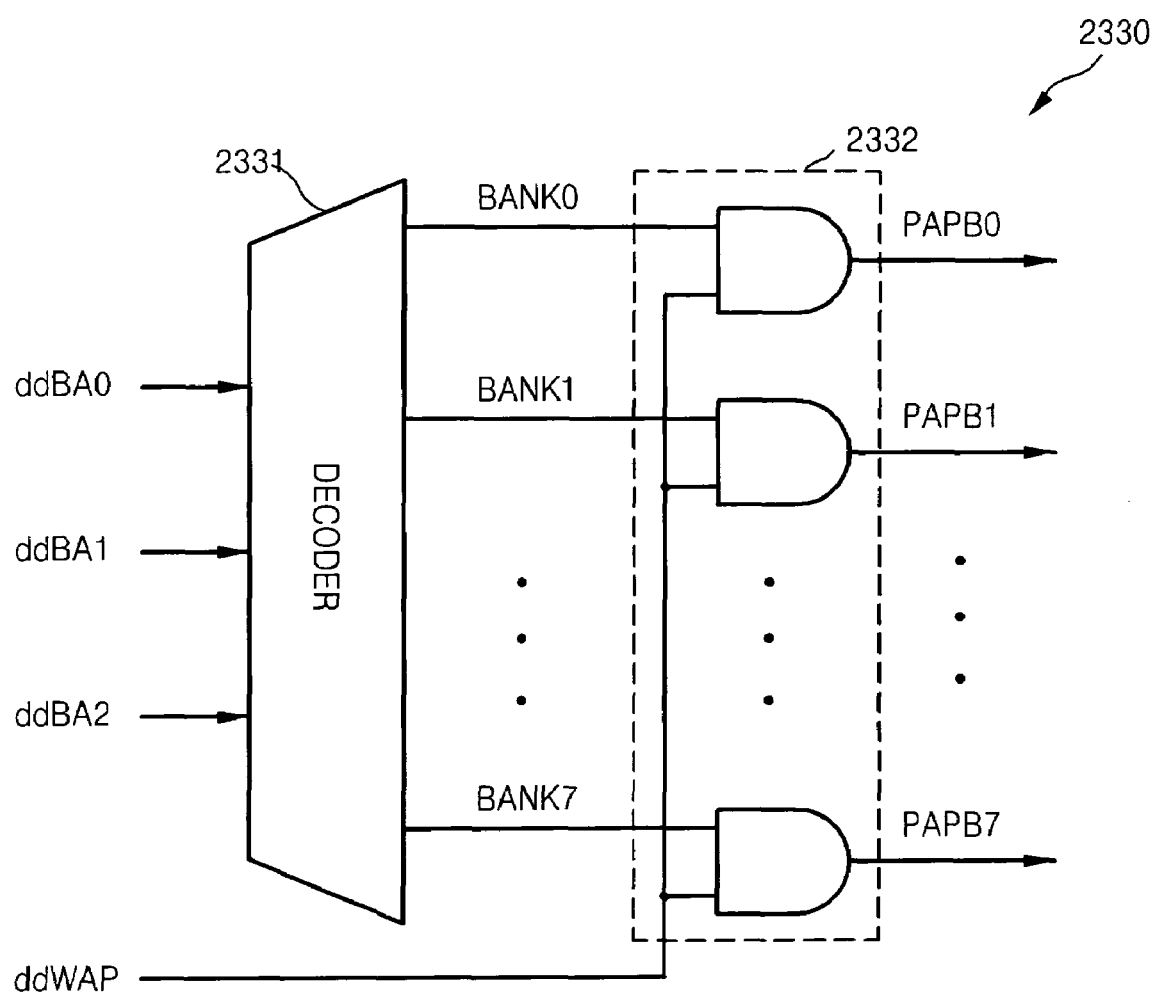
FIG. 22 is a circuit diagram of a precharge main signal generator according to another example embodiment of the present invention.

FIG. 22 is a circuit diagram of the precharge main signal generator 2330 of FIG. 19 according to another example embodiment of the present invention. In the example embodiments of FIGS. 19 and 22, the precharge main signal generator 2330 may include a decoder 2331 and an AND element array 2332.

In the example embodiment of FIG. 22, the decoder 2331 may output a precharge sub-signal BANK (e.g., BANK0 through BANK7) corresponding to the plurality of the banks 2230, respectively, based on the bank delay signal ddBA.

In the example embodiment of FIG. 22, the AND element array 2332 may include AND elements connected in parallel. Each of the AND elements may perform an AND operation on a corresponding one of the precharge sub-signals BANK0 through BANK7 and the second precharge command delay signal ddWAP. The second precharge command delay signal ddWAP may be a given signal output from the last register of the first register array 2311 by delaying the delayed write auto-precharge command signal dWAP by a given number of clock cycles (e.g., 12 clock cycles) of the internal clock signal PCLK. Accordingly, the precharge main signal PAPB output from the precharge main signal generator 2330 may be output after the write recovery time tWR subsequent to receiving the delayed write auto-precharge command signal dWAP.

Figure 23:
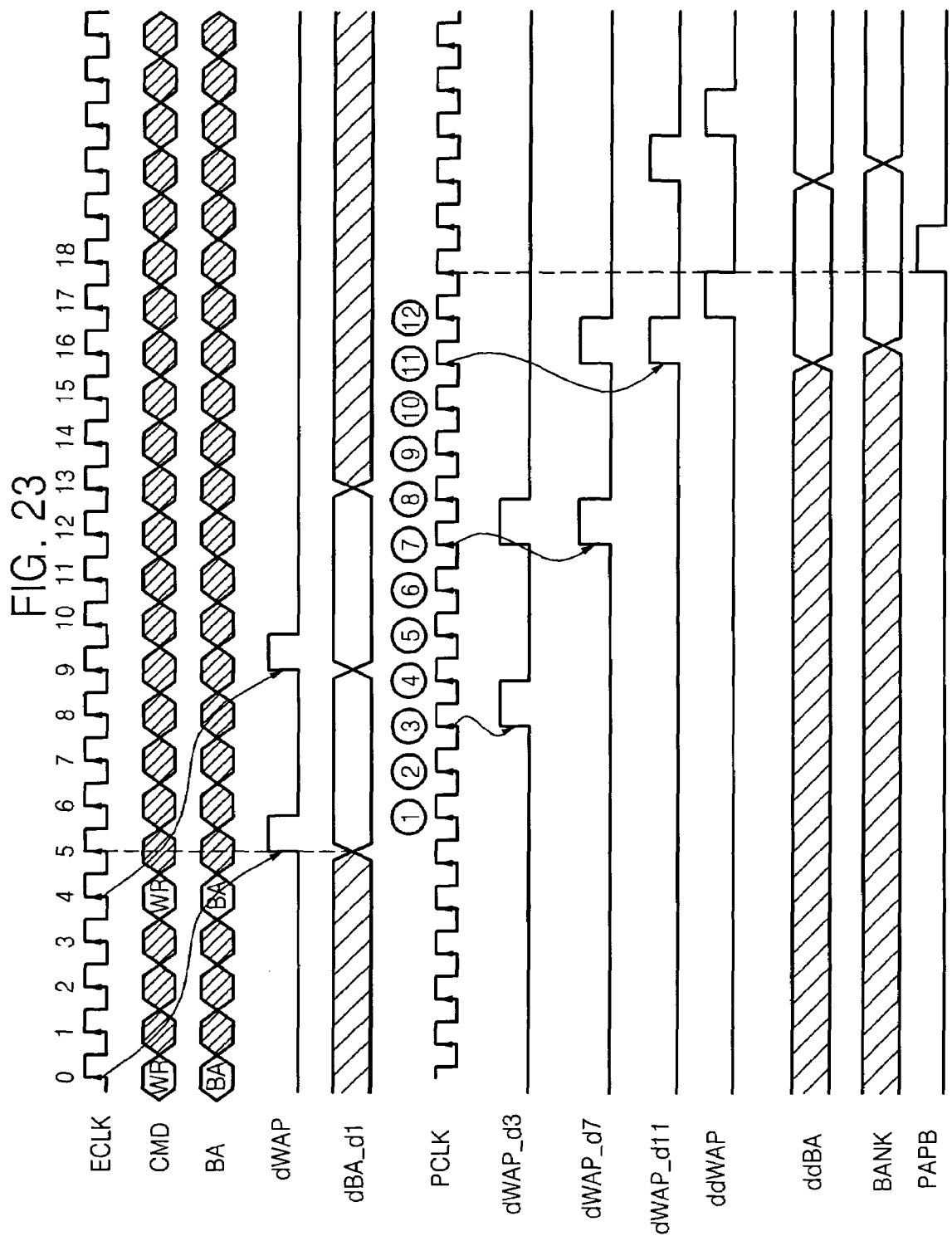
FIG. 23 is a signal timing chart illustrating an operation of an auto-precharge control circuit according to another example embodiment of the present invention.
Figure 24:
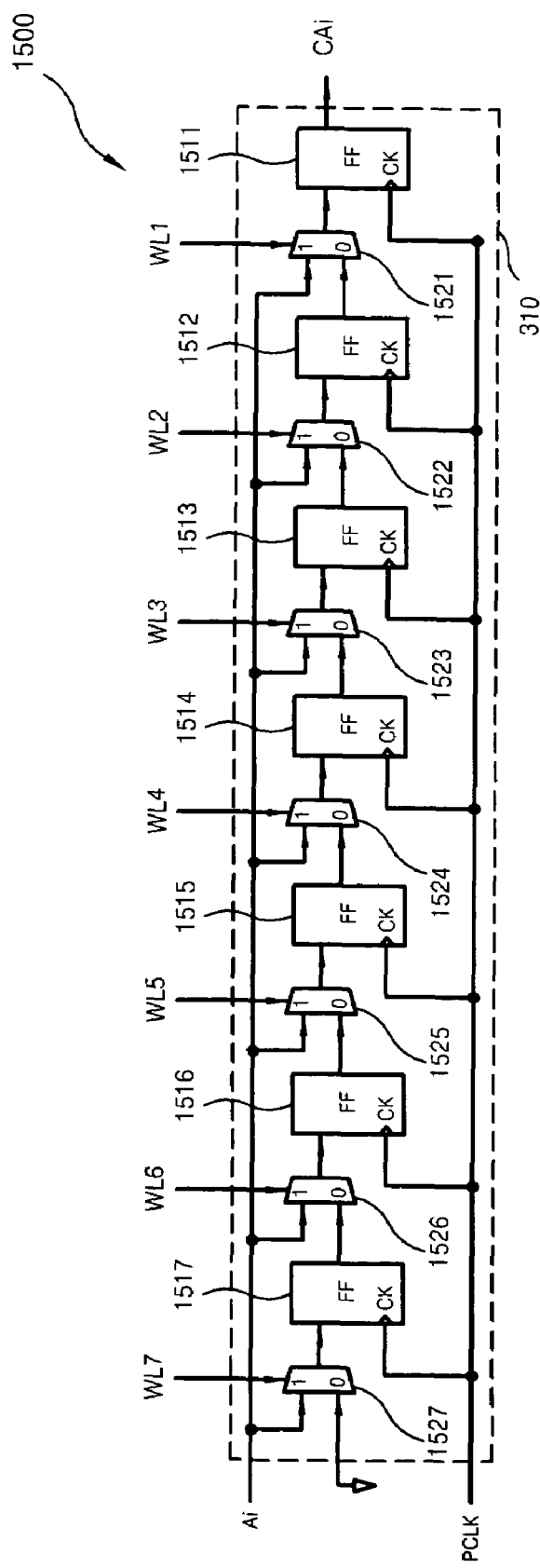
FIG. 24 is a circuit diagram illustrating a conventional latency control circuit.
Figure 25:
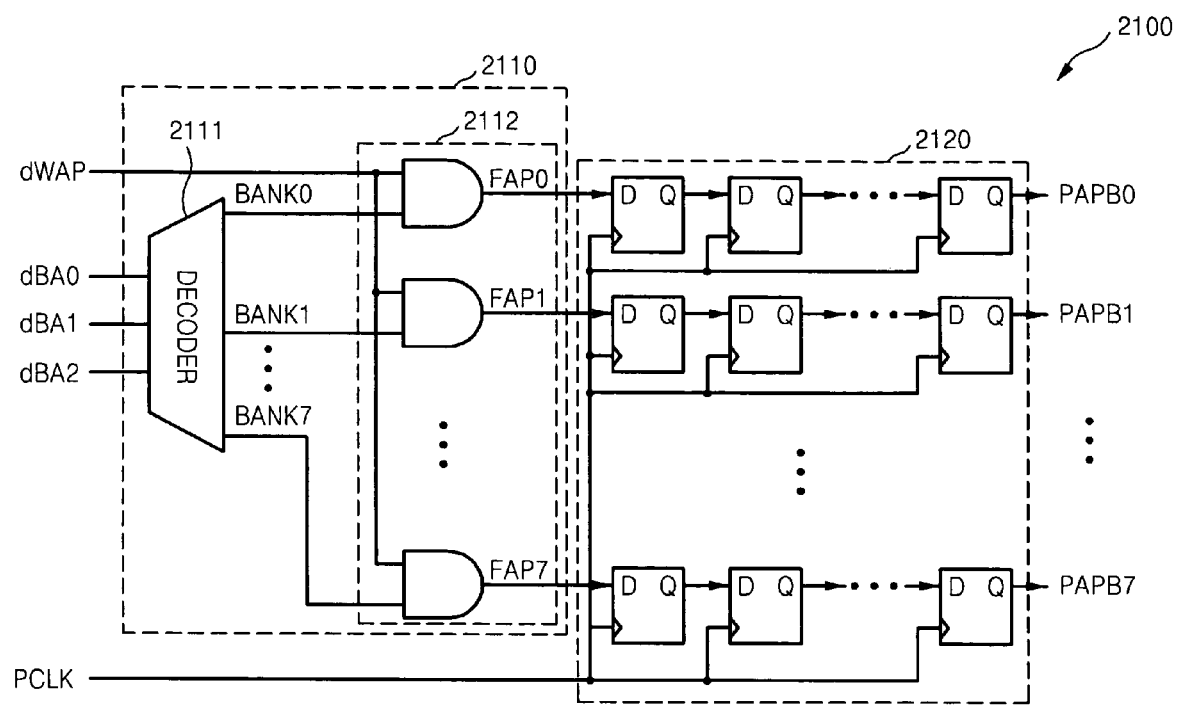
FIG. 25 illustrates a conventional auto-precharge control circuit which delays a write auto-precharge command by a write recovery time tWR.

FIG. 23 is a signal timing chart illustrating an operation of the auto-precharge control circuit 2300 according to another example embodiment of the present invention. Example operation of the auto-precharge control circuit 2300 will now be described with reference to FIGS. 18 through 23.

In example operation of the auth-precharge control circuit 2300, with reference to FIGS. 18 through 23, the write command WR may be externally input at the minimum interval between commands, tCCD (e.g., 4 cycle clocks), in synchronization with a given rising edge of the external clock signal ECLK. The write command WR may be an external command determined by the combination of the command signals /CS, /RAS, /CAS, and /WE input to the command detection circuit 2210. If the given bit signal A10 is input at the first logic level (e.g., a higher logic level or logic "1") along with the write command WR, the write auto-precharge command signal WAP may be internally generated.

In example operation of the auth-precharge control circuit 2300, with reference to FIGS. 18 through 23, when the write command WR is input, the bank address BA (BA0 through BA2) for selecting a bank at which the write command WR will be executed may be concurrently (e.g., simultaneously) input to the address buffer 2220. After a number of clock cycles (e.g., five clock cycles) corresponding to the write latency tWL plus the data burst period tBURST following the write command WR and the bank address BA are input, the delayed write auto-precharge command signal dWAP may be enabled (e.g., set to the first logic level) by the latency control circuit 2250. Thereafter, a write operation may be performed.

In example operation of the auth-precharge control circuit 2300, with reference to FIGS. 18 through 23, the signal dBA_d1 may be output from the first registers in the respective second register arrays 2321, 2322 and 2323 included in the bank address delay unit 2320 by delaying the buffered bank address signal dBA in response to the delayed write auto-precharge command signal dWAP.

In example operation of the auth-precharge control circuit 2300, with reference to FIGS. 18 through 23, the first precharge command delay signals dWAP_d3, dWAP_d7 and dWAP_d11 and the second precharge command delay signal ddWAP may be output from the auto-precharge control circuit 2300 in synchronization with the rising edges of the respective third, seventh, eleventh and twelfth clock cycles, respectively, of the internal clock signal PCLK following the enabling of the delayed write auto-precharge command signal dWAP.

In example operation of the auth-precharge control circuit 2300, with reference to FIGS. 18 through 23, the bank delay signal ddBA may be output from the bank address delay unit 2320 by delaying the bank address signal dBA based on the delayed write auto-precharge command signal dWAP and the first precharge command delay signals dWAP_d3, dWAP_d7 and dWAP_d11. The bank delay signal ddBA may be output in synchronization with the rising edge of the eleventh clock cycle of the internal clock signal PCLK following the enabling of the bank address signal dBA.

In example operation of the auth-precharge control circuit 2300, with reference to FIGS. 18 through 23, in the precharge main signal generator 2330, the precharge sub-signal BANK may be delayed by the decoder 2331 from the enabling of the bank delay signal ddBA. Accordingly, the precharge main signal PAPB may be output in synchronization with a first rising edge of the internal clock signal PCLK after the enabling of the second precharge command delay signal ddWAP. In an example, the synchronized output may occur 12 clock cycles of the internal clock signal PCLK (e.g., the write recovery time tWR) after the enabling of the delayed write auto-precharge command signal dWAP.

In example operation of the auth-precharge control circuit 2300, with reference to FIGS. 18 through 23, the precharge main signal PAPB may be output to a given bank (e.g., bank 3 if dBA=011), which may be selected from among the plurality of banks (e.g., 8 banks) based on the bank address signal dBA.

Accordingly, in an example, the auto-precharge control circuit 2300 included in the semiconductor memory device 2200 may include 12 registers within the first register array 2311 and 4 registers included in each of the second register arrays 2321, 2322 and 2323, (e.g., for a total of 24 registers) and may control a write auto-precharge operation. The number of registers included in the auto-precharge control circuit 2300 may be relatively small as compared to the number of registers (e.g., 96 registers) included within a conventional auto-precharge control circuit.

As described above, in accordance with example embodiments of the present invention, a latency control circuit may have a "master-slave" structure, such that the number of registers included in a slave unit may be reduced in proportion to a tCCD or a BL. Thus, the total number of registers performing latency control may be reduced, thereby reducing a current consumption and a layout area of semiconductor memory devices.

In another example embodiment of the present invention, a write auto-precharge command signal, which may be split at a minimum interval between commands, instead of an internal clock signal may be used in order to delay a bank address signal, thereby reducing a number of registers required to execute a write auto-precharge command. Thus, an area occupied by the registers in a layout may be reduced. Also, a loading of the internal clock signal may be reduced, thereby reducing current or power consumption of a semiconductor memory device.

Example embodiments of the present invention being thus described, it will be obvious that the same may be varied in many ways. For example, while the example embodiments of the present invention are described as including particular numbers of registers, banks, etc., it is understood that other example embodiments of the present invention may be directed to any number of banks, registers, etc. Further, it is understood that the above-described first and second logic levels may correspond to a higher level and a lower logic level, respectively, in an example embodiment of the present invention. Alternatively, the first and second logic levels/ states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A latency control circuit, comprising:
   a master unit activating a plurality of master signals based on a reference signal and an internal clock signal; and
   a plurality of slave units receiving the at least one master signal and a plurality of signals, each of the plurality of slave units outputting an output signal based at least in part upon one of the received plurality of signals;
   wherein
      the master unit includes a plurality of master registers each receiving the internal clock signal,
      each of the slave units includes a plurality of slave registers each receiving a corresponding master signal from among the plurality of master signals,
      the plurality of master registers are configured to delay the reference signal sequentially in response to the internal clock signal, and
      the plurality of slave registers are configured to delay a corresponding signal of the plurality of signals sequentially in response to the plurality of master signals.

2. The latency control circuit of claim 1, wherein the plurality of master signals have intervals between one another not exceeding a minimum interval between commands, and the received plurality of signals corresponds to one of a plurality of command signals and a plurality of address signals.

3. The latency control circuit of claim 2, wherein the output signal is based on latency information.

4. The latency control circuit of claim 2, wherein the number of the slave registers included within each slave unit is less than the number of the master registers included within the master unit.

5. The latency control circuit of claim 3, wherein the reference signal is a write command signal internally generated based on a received write command, the plurality of address signals includes column address signals and bank address signals, and each of the slave units receives a corresponding address signal from among the plurality of address signals.

6. The latency control circuit of claim 5, wherein the master unit includes:
   a write master signal generator activating a first write master signal among the plurality of master signals "m" clock cycles after the write command signal is activated, where "m" is a positive integer and is based on the latency information; and
   a burst master signal generator activating a burst master signal "n" clock cycles after the first write master signal is activated, where "n" is a positive integer and based on a burst length.

7. The latency control circuit of claim 6, wherein when (m−k) is greater than a threshold value, the master unit further activates a second write master signal among the plurality of master signals (m−k) clock cycles after the write command signal is activated, where "k" is a positive integer indicating a number of clock cycles corresponding to an integer multiple of the minimum interval between commands.

8. The latency control circuit of claim 7, wherein the threshold value is zero.

9. The latency control circuit of claim 6, wherein each of the slave units includes:
   a first register latching and outputting a signal selected in response to the first write master signal; and
   a second register latching an output signal of the first register in response to the burst master signal and outputting the latched output signal as a delayed address signal,
   wherein the selected signal is generated by a third register which latches and outputs the corresponding address signal in response to the second write master signal if the second write master signal is activated, and the selected signal is the corresponding address signal if the second write master signal is not activated.

10. The latency control circuit of claim 5, wherein the master unit includes:
    "m" registers, where "m" is a positive integer;
    a plurality of selection circuits; and
    "n" registers connected in series to shift an output signal of an m-th register among the "m" registers in response to the internal clock signal, where "n" is a positive integer,
    wherein each of the selection circuits outputs, as an input signal of one corresponding register among the "m" registers, one signal between the write command signal and an output signal of another corresponding register among the "m" registers based on a corresponding latency signal among a plurality of latency signals generated based on the latency information,
    each of the "m" registers latches a signal output from a corresponding selection circuit among the plurality of selection circuits in response to the internal clock signal,
    the output signal of the m-th register among the "m" registers is a first write master signal among the plurality of master signals, and
    an output signal of a (burst length/2)-th register among the "n" registers is a burst master signal among the plurality of master signals.

11. The latency control circuit of claim 10, wherein an output signal of a (m-(burst length/2))-th register among the "m" registers is a second write master signal among the plurality of master signals.

12. The latency control circuit of claim 10, wherein each of the slave units includes:
    a first register latching the corresponding address signal in response to the second write master signal;
    an address selection circuit selectively outputting one of the corresponding address signal and an output signal of the first register based on the corresponding latency signal;
    a second register latching an output signal of the address selection circuit in response to the first write master signal; and
    a third register latching an output signal of the second register in response to the burst master signal.

13. The latency control circuit of claim 12, wherein a first interval between an activation of the second write master signal and an activation of the first write master signal and a second interval between an activation of the first write master signal and an activation of the burst master signal each correspond to (burst length/2) cycles of the internal clock signal.

14. The latency control circuit of claim 5, wherein the master unit receives the write command signal, delays the write command signal by 1 through "m" clock cycles of the internal clock signal, combines the internal clock signal with at least one signal among signals obtained by delaying the write command signal by 1 through "m" clock cycles, and combines the write command signal with the internal clock signal, thereby generating the plurality of master signals, where "m" is a positive integer.

15. The latency control circuit of claim 14, wherein each of the slave units receives the corresponding address signal and outputs a signal corresponding to the latency information among the delayed address signals.

16. The latency control circuit of claim 5, wherein the master unit includes:
   a plurality of master registers connected in series, each of the plurality of master registers receiving the internal clock signal; and
   a plurality of logic gates each combining an output signal of a corresponding master register among the plurality of master registers with the internal clock signal and combining the write command signal with the internal clock signal, to generate the plurality of master signals,
   wherein a first master register among the plurality of master registers receives the write command signal, and each of the plurality of master registers other than the first master register among the plurality of registers receives an output signal of another of the master registers.

17. The latency control circuit of claim 16, wherein each of the slave units includes:
   a plurality of slave registers connected in series, each of the slave registers responding to a corresponding master signal among the plurality of master signals;
   a switching circuit outputting an output signal corresponding to the latency information among output signals of the plurality of slave registers; and
   a latch latching the output signal of the switching circuit,
   wherein a first slave register among the plurality of slave registers receives the corresponding address signal, and each of the plurality of slave registers other than the first slave register receives an output signal of another of the plurality of slave registers.

18. The latency control circuit of claim 5, wherein the master unit generates the plurality of master signals having an interval of a number of clock cycles equal to the minimum interval between commands (tCCD) minus α after the write command signal is activated, where α is a value equal to or greater than 0 and less than the minimum interval between commands (tCCD).

19. The latency control circuit of claim 3, wherein the latency information is associated with at least one of write latency and additive latency.

20. The latency control circuit of claim 1, wherein the plurality of master signals include at least a first master signal activated "m" clock cycles after the reference signal is activated, "m" being a number based on latency information.

21. The latency control circuit of claim 20, wherein the master unit further outputs a second master signal activated "n" clock cycles after the first master signal is activated, where "n" is a number corresponding to (burst length/2) and each of the plurality of slave units latches one of the plurality of signals in response to the second master signal.

22. The latency control circuit of claim 21, wherein the master unit includes (m+n) registers connected in series, each of the (m+n) registers latching an input signal in response to the internal clock signal, each of the slave units including at least two registers connected in series, the at least two registers latching their input signals in response to the first master signal and the second master signal, respectively.

23. The latency control circuit of claim 20, wherein the reference signal is a write command signal generated based on an external write command,
   if (n−k) is greater than 0 where "k" is a positive integer indicating a number of clock cycles corresponding to an integer multiple of a minimum interval between commands (tCCD), the master unit further outputs a second master signal activated (n−k) clock cycles after the write command signal is activated, and
   each of the slave units latches a corresponding address signal among the plurality of signals in response to the second master signal and latches the corresponding address signal, which has been latched in response to the second master signal, in response to the first master signal.

24. The latency control circuit of claim 20, wherein the latency information is associated with one of write latency and additive latency.

25. The latency control circuit of claim 1, wherein the plurality of master signals have an interval between master signals equal to a minimum interval between commands minus α, where α is a value equal to or greater than 0 and less than the minimum interval between commands, and each of the plurality of slave units delays a corresponding signal among the received plurality of signals and outputs the output signal so as to correspond to latency information associated with the delayed signals.

26. The latency control circuit of claim 25, wherein the latency information is associated with one of write latency and additive latency.

27. The latency control circuit of 25, wherein α is equal to one of 0 and 0.5 tCK, tCK corresponding to a clock cycle of the internal clock signal.

28. The latency control circuit of claim 25, wherein the reference signal is a write command signal generated based on an external write command, and the master unit includes:
   a plurality of master registers connected in series, each of the master registers receiving the internal clock signal; and
   a plurality of logic gates, each of the plurality of logic gates combining an output signal of a corresponding master register among the plurality of master registers with the internal clock signal and combining the write command signal with the internal clock signal, to generate the plurality of master signals,
   wherein the plurality of master registers includes a first master register receiving the write command signal, and each of the plurality of master registers other than the first master register receives an output signal of another of the plurality of master registers.

29. A semiconductor memory device, comprising:
   a memory cell array including a plurality of memory cells;
   the latency control circuit of claim 1;
   a clock circuit generating the internal clock signal based on an external clock signal;
   a command detection circuit receiving and decoding an external command signal, thereby generating a decoded internal command signal;
   a mode register set circuit setting latency information in response to a first command signal in the decoded internal command signal,
   wherein the received plurality of signals corresponds to a plurality of address signals for designating a memory cell, to/from which data is configured to be written and read, based on latency information.

30. The semiconductor memory device of claim 29, wherein the master unit includes:
  a plurality of master registers each receiving the internal clock signal,
  wherein each of the plurality of slave units includes a plurality of slave registers receiving a corresponding master signal among the plurality of master signals.

31. The semiconductor memory device of claim 30, wherein the master unit generates the plurality of master signals in response to a second command signal, the second command signal being a write command signal internally generated based on a received write command.

32. A method of controlling latency, comprising:
  activating at least one master signal based on a reference signal and an internal clock signal by a master unit including a plurality of master registers each receiving the internal clock signal;
  receiving at least one master signal; and
  receiving a plurality of signals and outputting an output signal based at least in part upon one of the received plurality of signals and latency information by a plurality of slave units each including a plurality of slave registers; wherein
  the plurality of master registers are configured to delay the reference signal sequentially in response to the internal clock signal, and
  the plurality of slave registers are configured to delay a corresponding signal of the plurality of signals sequentially in response to the at least one master signal.

* * * * *